United States Patent
Barto et al.

(10) Patent No.: US 6,725,113 B1
(45) Date of Patent: Apr. 20, 2004

(54) LOT START AGENT THAT DETERMINES VIRTUAL WIP TIME INCLUDING AN EXPONENTIALLY WEIGHTED MOVING AVERAGE CYCLE TIME

(75) Inventors: Larry D. Barto, Austin, TX (US); Steven C. Nettles, Johnson City, TX (US); Yiwei Li, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 39 days.

(21) Appl. No.: 10/133,113

(22) Filed: Apr. 26, 2002

Related U.S. Application Data
(60) Provisional application No. 60/347,680, filed on Oct. 23, 2001.

(51) Int. Cl.[7] .............................................. G06F 19/00
(52) U.S. Cl. ........................ 700/99; 700/104; 700/108; 700/114
(58) Field of Search .................... 700/99, 104, 108, 700/114

(56) References Cited

U.S. PATENT DOCUMENTS

| | | | |
|---|---|---|---|
| 5,446,671 A | * 8/1995 | Weaver et al. | 700/100 |
| 5,751,580 A | * 5/1998 | Chi | 700/101 |
| 5,838,565 A | * 11/1998 | Hsieh et al. | 700/11 |
| 5,880,960 A | * 3/1999 | Lin et al. | 700/99 |
| 5,946,661 A | * 8/1999 | Rothschild et al. | 705/7 |
| 5,946,662 A | * 8/1999 | Ettl et al. | 705/8 |
| 6,128,540 A | * 10/2000 | Van Der Vegt et al. | 700/36 |
| 6,243,612 B1 | * 6/2001 | Rippenhagen et al. | 700/100 |
| 6,259,959 B1 | * 7/2001 | Martin | 700/99 |
| 6,463,350 B2 | * 10/2002 | Fukuda et al. | 700/121 |
| 6,473,721 B1 | * 10/2002 | Chacon et al. | 702/182 |

OTHER PUBLICATIONS

Web page: http://www.sytsma.com/tqmtools/ewma.html□□"Exponentially Weighted Moving Average Charts", Jun. 9, 1999.*

Bakhodir A Ergashev, "An Analytical Approach for Studying EWMA Control Charts", University of World Economy and Diplomacy, 1998.*

Resende, Mauricio Guilherme De Carvalho "Shop Floor Scheduling of Semiconductor Wafer Manufacturing," Dissertation, University of California, Berkeley, 1987.

Shen, W. and D. Norrie, "An Agent–Based Approach for Dynamic Manufacturing Scheduling," *Proceedings of Workshop on Agent–Based Manufacturing*, 1998, pp. 117–128.

Sikora, R. and M.J. Shaw, "Coordination Mechanisms for Multi–Agent Manufacturing Systems: Applications to Integrated Manufacturing Scheduling," *IEEE Transactions on Engineering Management*, vol. 44, 1997, pp. 175–187.

Sousa, P. and C. Ramos, "A Dynamic Scheduling Holon for Manufacturing Orders," *Journal of Intelligent Manufacturing*, vol. 9, 1998, pp. 107–112.

(List continued on next page.)

*Primary Examiner*—Leo Picard
*Assistant Examiner*—Michael D. Masinick
(74) *Attorney, Agent, or Firm*—Hamilton & Terrile, LLP; Stephen A. Terrile

(57) ABSTRACT

A system and method are provided for calculating a plurality of bottleneck delta virtual work in process time ("VWIP") values. Each of the bottleneck delta VWIP values represents the time until one of n bottleneck workstations begins to risk starvation. The calculating includes deriving one or more baseline cycle times based on an X-factors method.

28 Claims, 9 Drawing Sheets

OTHER PUBLICATIONS

Upton, D.M., M.M. Barash, and A.M. Matheson, "Architectures and Auctions in Manufacturing," *International Journal of Computer Integrated Manufacturing,* vol. 4, 1991, pp. 23–33.

Vaario, J. and K. Ueda, "An Emergent Modelling Method for Dynamic Scheduling," *Journal of Intelligent Manufacturing,* vol. 9, 1998, pp. 129–140.

Weber, Alan, "Material Traceability—The Missing Link in TAP Systems," Presentation of the Test, Assembly and Packaging Automation and Integration '99 Conference.

Weber, Alan "APC Framework: Raising the Standard for FAB Automation and Integration," Presentation of the Equipment Automation Conference 1st European Symposium on Semiconductor Manufacturing, Apr. 19, 1999.

Wein, Lawrence, M., "Scheduling Semiconductor Wafer Fabrication," *IEEE Transactions on Semiconductor Manufacturing,* vol. 1, No. 3, Aug. 1998, pp. 115–130.

Wellman, M.P., W.E. Walsh, P.R. Wurman, J.K. MacKie–Mason, "Auction Protocols for Decentralized Scheduling," http://www–personal.engin.umich.edu/~wew/Papers/mb–scheduling–extended.ps.Z, University of Michigan, Ann Arbor, 1998.

Axtell, Robert and Epstein, Joseph, "Distributed Computation of Economic Equilibria via Bilateral Exchange" Brookings Institute and Sante Fe Institute, Mar. 1997.

U.S. patent application Ser. No. 60/347,680 filed Oct. 23, 2001, entitled "Lot Start Agent that Determines Delta VWIP for Each Bottleneck Stations in the Semiconductor Manufacturing Process" and naming Larry D. Barton, Steven C. Nettles and Yiwei Li as inventors.

U.S. patent application Ser. No. 09/825,255, filed Apr. 3, 2001 entitled Starvation Avoidance Lot Start Agent (SALSA) and naming Larry D. Barto, Steven C. Nettles and Yiwei as inventors.

U.S. patent application Ser. No. 09/881,936, filed Jun. 15, 2001 entitled "Lot Start Agent that Calculates Virtual WIP Time in a Multi–Product and Multi–Bottleneck Manufacturing Environment" and naming Larry D. Barto, Steven C. Nettles and Yiwei as inventors.

U.S. patent application Ser. No. 10/113,671, filed Apr. 1, 2002 entitled "Lot Start Agent that Determines Delta Virtual WIP Time for Each Bottleneck in a Multi–Product and Multi–Bottleneck Manufacturing Environment" and naming Larry D. Barto, Steven C. Nettles and Yiwei Li as inventors.

U.S. patent application Ser. No. 10/154,902, filed on May 23, 2002, entitled Lot Start Agent that Determines Quantity and Timing for Lot Starts and naming Larry D. Barto, Steven C. Nettles and Yiwei Li as inventors.

U.S. patent application Ser. No. 10/132,961, filed on Apr. 26, 2002, entitled "Lot Start Agent that Determines Virtual WIP Time Including Calculating a Lead Time" and naming Larry D. Barto, Steven C. Nettles and Yiwei Li as inventors.

Baumgärtel, H., S. Bussman, and M. Klosterberg, "Combining Multi–Agent Systems and Constraint Techniques in Production Logistics," *Proceedings of Artificial Intelligence, Simulation, and Planning in High Autonomous Systems,* 1996.

Bonvik, Asbjoern M, "Performance Analysis of Manufacturing Systems Under Hybrid Control Policies," *Doctoral Thesis Proposal,* Sep. 22, 1995, pp. 1–15.

Bonvik, Asbjoern M, "Performance Analysis of Manufacturing Systems Under Hybrid Control Policies," *Doctoral Thesis Proposal,* Oct. 3, 1995, pp. 1–15.

"Agent Enhanced Manufacturing System Initiative," Technologies for the Integration of Manufacturing Applications (TIMA) (Oct. 1997), NIST Advanced Technology Program http://jazz.nist.gov/atpcf/pjbriefs/pjbrief.cfm ProjectNumber=97–05–0018, Sep. 6, 1999.

"Factory Integration," The National Roadmap for Semiconductors: Technology Needs, 1997 Edition http://notes.sematech.org/ntrs/PubINTRS.nsf/pages/97melec.htm.

Axtell, Robert and Joshua Epstein, "Distributed Computation of Economic Equilibria via Bilateral Exchange," *Brookings Institution of Sante Fe Institute,* Mar. 1997.

Bonvik, Asbjoern M., Christopher Couch, Stanley B. Gershwin, "Improving a Kanban Controlled Production Line Through Rapid Information Dissemination," Jul. 10, 1995.

Burke, P. and P. Prosser, "The Distributed Asychronous Scheduler," *Intelligent Scheduling,* Morgan Kaufman Publishers, Inc., San Francisco, 1994 pp. 309–322.

Butler, J. and H. Ohtsubo, "ADDYMS: Architecture for Distributed Dynamic Manufacturing Scheduling," *Artificial Intelligence Applications in Manufacturing,* AAAIPress/The MIT Press, Menlo Park, CA, 1992, pp. 199–214.

Ehteshami, Babak, Raja G. Petrakian and Phyliss M. Shabe, "Trade–Offs in Cycle Time Management Hot Lots," *IEEE Transactions on Semiconductor Manufacturing,* vol. 5, No. 2, pp. 101–106.

Fordyce, K. and G.G. Sullivan, "Logistics Management System (LMS): Integrating Decision Technologies for Dispatch Scheduling in Semiconductor Manufacturing," *Intelligent Scheduling,* Morgan Kaufman Publishers, Inc., San Francisco, 1994 pp. 309–322.

Fordyce, Kenneth, "Logistics Management System (LMS): An Advanced Decision Support System for Fourth Decision Tier–Dispatch or Short Interval Scheduling," pp. 1–58.

Gere, William S. Jr., "Heuristics in Job Shop Scheduling," *Management Science,* vol. 13, No. 3, Nov. 1966, pp. 167–191.

Glassey, C. Roger and Maruricio G. C. Resende, "Closed–Loop Job Release Control for VLSI Circuit Manufacturing," *IEEE Transactions on Semiconductor Manufacturing,* vol. 1, No. 1, Feb. 1988.

Hynyen, J.E., "BOSS: An Artificially Intelligent System for Distributed Factor Scheduling," *Computer Applications in Production and Engineering,* Elsevier, 1989, pp. 667–677.

Interrante, L. and S. Goldsmith, "Emergent Agent–Based Scheduling of Manufacturing Systems," *Proceedings of Workshop on Agent–Based Manufacturing,* 1998, pp. 47–57.

Juba, Robert C., Paul N. Keller, Alton F. Verity, "Production Improvements Using a Forward Scheduler," Undated.

Li, Shu, Tom Tang, Donald W. Collins, "Minimum Inventory Variability Schedule With Applications in Semiconductor Fabrication," *IEEE Transactions on Semiconductor Manufacturing,* vol. 9, No. 1, Feb. 1996, pp. 145–149.

Lin, G.Y.J and J. Solberg, "Integrated Shop Floor Control Using Autonomous Agents," *IIE Transactions,* 24(3):57–71, 1992.

Lu, Steve C.H., Depa Ramaswamy, P.R. Kumar, "Efficient Scheduling Policies to Reduce Mean and Variance of Cycle–Time in a Semiconductor Manufacturing Plants," *IEEE Transactions Semiconductor Manufacturing,* :vol. 7, No. 3, Aug. 1994, pp. 374–388.

Martin–Vega, Louis A., Mark Pippin, Elaine Gerdon and Randy Burcham, "Applying Just–in–Time in a Wafer Fab: A Case Study," *IEEE Transactions on Semiconductor Manufacturing,* vol. 2, No. 1, Feb. 1999, pp. 16–22.

Murthy, S., R. Akkiraju, J. Rachlin, and F. Wu, "Agent–Based Cooperative Scheduling," Proceedings of AAAI Workshop on Constraints and Agents, AAAI Press, 1997 pp. 112–117.

"ObjectSpace Fab Solutions Semiconductor Product Development Overview," Presented at SemiCon Southwest, 1998.

Parunak, Van and Larry Barto, "Agents Do It In Time, Experiences with Agent–Based Manufacturing Scheduling," *Presentation*, Conference Proceeding "Embracing Complexity," Sponsored by Earnest & Young, Jul. 27, 1999.

Parunak, Van, "Agent Based Models and Manufacturing Processes, Presentation," Conference Proceeding "Embracing Complexity," Sponsored by Earnest & Young, Jul. 1999.

Radin, Dan—Presenter, "Agent Enhance Manufacturing Systems Initiative (AEMSI) Project," Presentation of the Workshop on Industrial Agents ERIM CEC, Nov. 12–13, 1998.

Ramos, C., Almeida, A. and Vale, Z. "Scheduling Manufacturing Tasks Considering Due Dates: A New Method Based on Behaviors and Agendas", *International Conference on Industrial and Engineering Applications of Artificial Intelligence Expert Systems,* Melbourne, Australia, 1995, pp. 745–751.

* cited by examiner

LOT START AGENT THAT DETERMINES VIRTUAL WIP TIME INCLUDING AN EXPONENTIALLY WEIGHTED MOVING AVERAGE CYCLE TIME

CROSS REFERENCE TO RELATED APPLICATIONS

This application claims priority to provisional U.S. patent application Ser. No. 60/347,680, filed on Oct. 23, 2001, entitled "Lot Start Agent That Determines Delta VWIP for Each Bottleneck Stations in the Semiconductor Manufacturing Process" and naming Larry D. Barto, Steven C. Nettles, Yiwei Li as inventors, the application being incorporated hereby references in its entirety.

This application relates to co-pending U.S. patent application Ser. No. 09/881,936, filed on Jun. 15, 2001, entitled "Lot Start Agent That Calculates Virtual WIP Time in a Multi-Product and Multi-Bottleneck Manufacturing Environment" and naming Larry D. Barto, Steven C. Nettles and Yiwei Li as inventors, the application being incorporated herein by reference in its entirety.

This application relates to co-pending U.S. patent application Ser. No. 09/825,225, filed on Apr. 3, 2001, entitled "Starvation Avoidance Lot Start Agent (SALSA)" and naming Larry D. Barto, Steven C. Nettles and Yiwei Li as inventors, the application being incorporated herein by reference in its entirety.

This application relates to co-pending U.S. patent application Ser. No. 10/113,671, filed on Apr. 1, 2002, entitled "Lot Start Agent that Determines Delta Virtual WIP Time for Each Bottleneck Station in a Multi-product and Multi-Bottleneck Manufacturing Environment" and naming Larry D. Barto, Steven C. Nettles and Yiwei Li as inventors, the application being incorporated herein by reference in its entirety.

This application relates to co-pending U.S. patent application Ser. No. 10/154,092, filed on May 23, 2002, entitled "Lot Start Agent that Determines Quantity and Timing for Lot Starts" and naming Larry D. Barto, Steven C. Nettles and Yiwei Li as inventors, the application being incorporated herein by reference in its entirety.

This application relates to co-pending U.S. patent application Ser. No. 10/132,961, filed on an even date herewith, entitled "Lot Start Agent that Determines Virtual WIP Time Including Calculating a Lead Time" and naming Larry D. Barto, Steven C. Nettles and Yiwei Li as inventors, the application being incorporated herein by reference in its entirety.

The U.S. Government has a paid-up license in this invention and the right in limited circumstances to require the patent owner to license others on reasonable terms as provided for by the terms of Cooperative Agreement No. 70NANB7H3041 awarded by the United States Department of Commerce, National Institute of Standards and Technology (NIST), Advanced Technology Program (ATP).

BACKGROUND OF THE INVENTION

1. Field of the Invention

This invention relates to automated semiconductor manufacturing process control, and more particularly to an active starvation avoidance lot start agent that calculates a delta virtual work in process time for each of a plurality of bottleneck workstations in a multi-product and multi-bottleneck manufacturing environment.

2. Description of the Related Art

Semiconductor factories are relatively complex and costly to operate. Automated control of semiconductor manufacturing processes can provide a mechanism for attaining optimal factory performance, improving the quality and lowering the cost of production, expanding the production rate, and relieving the drudgery of many routine, repetitive manual operations.

Controlling a semiconductor factory, however, is a challenging task. A semiconductor factory ("fab") is a complex environment where numerous parts, typically 40 thousand wafers or more, and numerous part types, typically 100 part types or more, are simultaneously being manufactured. As each wafer moves through the fab, it may undergo more than 300 processing steps, many of which use the same machines. A large factory may contain approximately 500 computer-controlled machines to perform this wafer processing. Routing, scheduling, and tracking material through one of these factories is a difficult and complicated task, even with the assistance of a computerized factory control system.

In attempting to develop computerized models and computerized control mechanisms for semiconductor manufacturing plants, the inventors have discovered that it is useful to utilize an object-oriented approach. Object-orientation is a technique for system modeling that models a system as a number of "objects" that interact. The result of this approach is the definition of a number of objects within the system that are related in some way. Each object is a specific instantiation of a particular class, with certain attributes and operations characterizing the class.

In developing a computerized system for modeling and controlling a semiconductor manufacturing plant, it is useful to understand the important role of "cycle time." Cycle time is the time it takes to manufacture a product from start to finish, and is defined to be the time a job spends in the manufacturing facility, including processing time plus waiting time. Cycle time is a key factory metric for manufacturing plants, including those in the semiconductor industry. Due to the complexity of the manufacturing process, product cycle times in semiconductor manufacturing facilities ("fab") can exceed 8 weeks.

Another important metric in the semiconductor fabrication context is the throughput rate. The throughput rate is the average number of wafers that leave the fab per unit of time.

For many reasons, it is highly desirable to reduce cycle time as much as possible without sacrificing factory throughput or on-time delivery. One reason is that reducing cycle time allows learning to occur more rapidly so yield and product improvements can be introduced more quickly. Also, an enterprise with low cycle times is inherently more flexible and can adapt quickly to changes in the marketplace or other business conditions. A third reason that it is desirable to minimize cycle time, and consequently, waiting time, is that a decrease in waiting time decreases the time a wafer is exposed to particles in the clean room, thus increasing yield.

Cycle time is related to Work-in-Process (WIP) by Little's Law:

$$WIP = \text{Cycle Time} * \text{Throughput Rate}$$

From this formula it is clear that, by holding the throughput rate constant and reducing WIP, cycle time is reduced. In order to maintain maximum throughput, idle time on the most highly utilized ("bottleneck") machines in the manufacturing process must be minimized. It is thus important not to reduce WIP so much that a "bottleneck" machine experiences idle time (i.e., "starves"), which results in lost production and reduction in throughput rate.

What is needed is an efficient, automated manner of reducing WIP in a semiconductor fab, and thereby reducing cycle time, without sacrificing throughput.

SUMMARY OF THE INVENTION

In the terminology of object-oriented computing, a software "agent" is an autonomous, active object. Given its set of methods and operations, a software agent can take independent action in response to local conditions, thereby generating adaptable system behavior. The present invention presents an agent-enhanced system that defines, configures, and deploys autonomous and mobile "software agents" that mimic and improve the functioning of "real world" agents in a semiconductor manufacturing plant such as factory workers, material, equipment, processes, etc. An example of a manufacturing facility that employs such an agent is a manufacturing facility that includes a computer system, the computer system having a processor and a memory, the computer system also including software code that implements one or more of the software objects described herein.

An automated system is provided in a facility that manufactures m products, where m>0 The system comprises a software object that provides for calculation of one or more bottleneck delta virtual work in process time ("VWIP") values. Each of the bottleneck delta VWIP values represents the amount of time until one of n bottleneck workstations begins to risk starvation, where n>0. VWIP is the amount of time a bottleneck will stay busy processing WIP that will reach the bottleneck in less time than new lot starts will reach the same bottleneck. In at least one embodiment, each of the bottleneck delta VWIP values is calculated as a mathematical function of virtual WIP time for the corresponding bottleneck workstation and a lower control limit for the corresponding bottleneck workstation. In at least one other embodiment, n>2 and the software object provides for calculation of a plurality of bottleneck delta VWIP values. The software object contains program code that provides for the foregoing functionality either directly or by invoking one or more other objects.

At least one other embodiment provides a method for performing calculations in a facility that manufactures m products, where m>0. The method comprises providing a software object that provides for calculation of a plurality of bottleneck delta VWIP values. Each of the bottleneck delta VWIP values represents the time until a corresponding one of n bottleneck workstations begins to risk starvation.

BRIEF DESCRIPTION OF THE DRAWINGS

The present invention may be better understood, and its numerous objects, features, and advantages made apparent to those skilled in the art by referencing the accompanying drawings.

FIG. 2, including

FIG. 5, including

The use of the same reference symbols in different drawings indicates similar or identical items.

DESCRIPTION OF THE PREFERRED EMBODIMENTS

The present invention is a collection of autonomous software agents that control various objects, machines, and processes within a semiconductor manufacturing facility ("fab"). The agents are collectively referred to herein as Agent-Enhanced Manufacturing System ("AEMS"). The AEMS agents are active elements that control the manufacturing process. The agents control the release of new lots into the manufacturing line, schedule lot processing, preventive maintenance and qualifications on machines, schedule lot movement, initiate execution of scheduled tasks, and react to changes in the factory state, such as unscheduled down time.

One skilled in the art will recognize that an agent or other software object can include one or more software objects. As used herein, the term "object" will be understood to be a software object that may, in turn, be composed of other software objects. Conversely, one skilled in the art will also recognize that the functionality of one object may be combined with other functionalities. It is to be understood that functionalities described as being associated with separate objects may be combined into the functionality associated with a single object. It is understood that software objects contain program code that provides for the functionality described herein.

Figure 1:
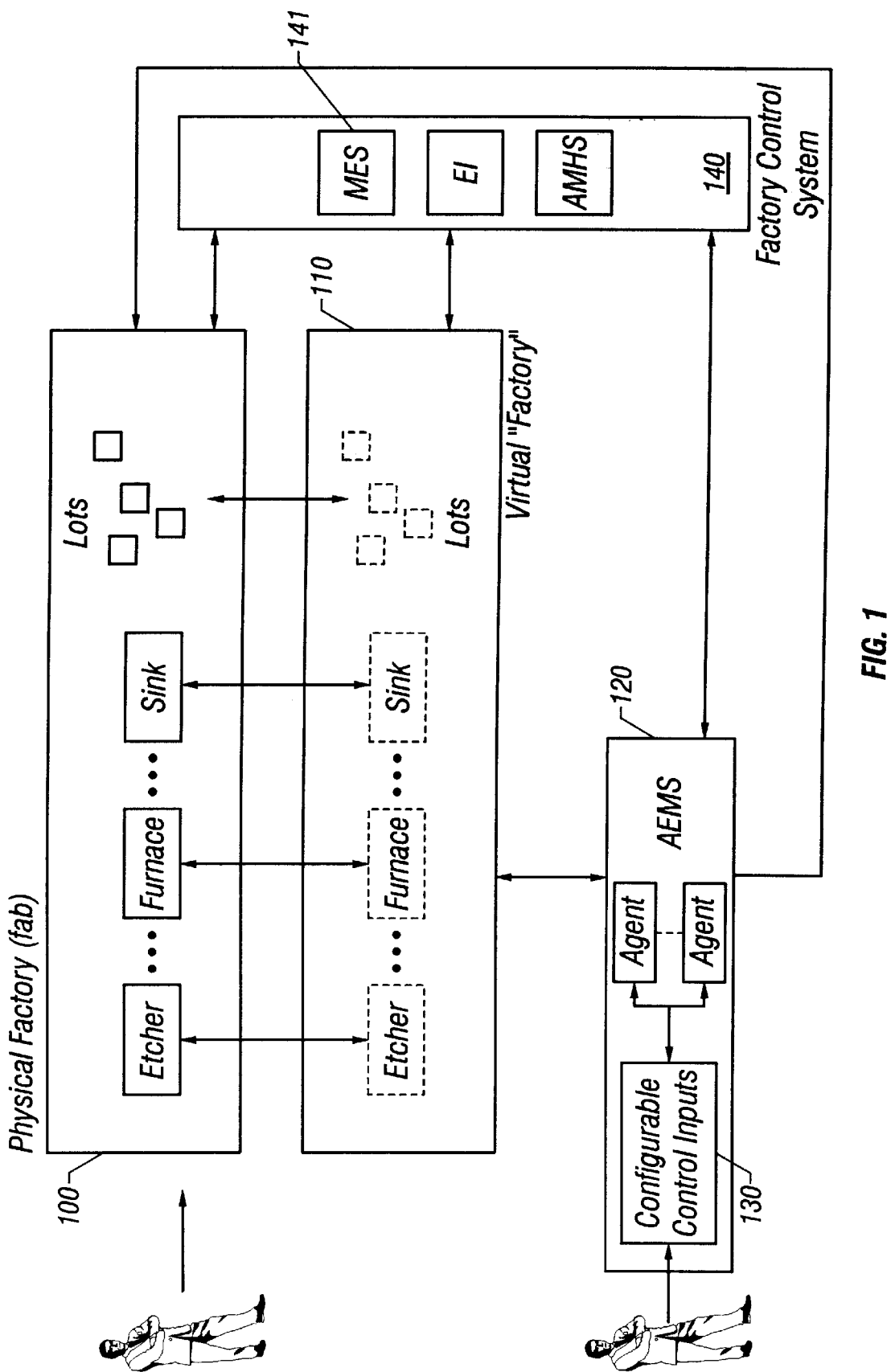
FIG. 1 is a block diagram depicting a high-level view of the Agent-Enhanced manufacturing System ("AEMS") environment.

FIG. 1 is a block diagram depicting a high-level view of the AEMS environment. In order to implement an agent-enhanced computerized modeling and control system for semiconductor processing, such as the AEMS 120, the system must receive information concerning factory 100 conditions. In order to accomplish this task, AEMS 120 works in conjunction with a virtual "Factory" 110 that contains objects corresponding to the physical elements of a fab 100, sometimes referred to below as "manufacturing domain entities." The software-simulated virtual facility is referred to herein as "the Factory" 110 and includes objects representing products, processes, operations, lots, machines and other manufacturing entities. The AEMS agents interact with the Factory 110 and the Factory Control System 140 to schedule, control, and optimize the manufacturing process in the fab 100.

The AEMS agents also utilize externally-configured control inputs 130, or "control knobs." Some of the externally-configured control inputs 130 include, without limitation, the safety factor to be used in the process of determining when to start new lots, and the identification of particular bottleneck stations (i.e., machine types) within the physical plant. The role of each of these control inputs will be discussed in further detail below.

FIG. 1 illustrates that each AEMS agent is one of many agents in an environment that provides automated control and optimization of a physical manufacturing plant, or fab. Use of agents in the present invention allows an innovative approach to the automated control of semiconductor manufacturing systems. In the prior art, automated semiconductor factory control systems are designed based on the assumption that people will be the active agents in the system. That is, they depend on people to initiate all factory operations. These prior art Manufacturing Execution Systems (MES) use a top-down control strategy.

In contrast, the present invention controls a fab using an active, bottom-up approach, which utilizes autonomous software agents that respond to information and events available from the factory floor. Factory control results from the interaction of software agents representing lots, equipment, and other processing resources. As contrasted with the centralized, top-down approach of prior art systems, the agent-enhanced system of the present invention handles the considerable complexity of a factory by dividing the job up among a larger group of smaller, simpler entities (i.e., agents).

In addition to its ability to better handle complexity, the agent-enhanced system of the present invention is also more responsive to local events. Because the agents in AEMS 120 represent the active entities in material processing (lots, equipment, etc.) they are more responsive to, and in fact often driven by, events that are local to those entities. For instance, the present invention can take equipment events into account and react accordingly, thereby operating more efficiently.

The agents in the present invention are autonomous, mobile agents that represent manufacturing entities such as product material (i.e., lots, batches, etc.), processing equipment, metrology equipment, durables (reusable processing resources like fixtures, reticles, etc.), and consumables (depletable processing resources such as photoresist, sputtering targets, etc.). In addition, the agents may also represent logical entities found in prior art systems, including specification repositories, recipe repositories, planning systems, and process models. As autonomous agents, the agents of the present invention operate independently of the person or program that initiated them. This key feature leads to a more highly automated factory, because agents handle many of the execution tasks that are a burden to factory operations personnel. This allows the agents, with the aid of computers, to perform more efficiently than humans can in handling routine execution activities with unwavering attention and consistency, gathering and tracking large amounts of data, and handling multiple tasks in parallel.

The autonomous agents of the present invention interact with each other. Each agent is programmed to perform the desired behavior, and agents of the same type are typically programmed with similar behavior. Agents must interact with other agents that are both the same type and different type than the agent. For example, lot agents and equipment agents are programmed to interact with each other, although each type of agent is programmed with different behavior. A further example arises in the context of scheduling operations. One particular lot may negotiate with a number of pieces of equipment. The lot agent has been programmed to try to find a piece of equipment that will allow the lot agent to meet its due date. The lot agent's programmed goals are to select a machine that provides the right type of processing and select a machine that can support its due date requirements. At the same time, the equipment agents are programmed to try to acquire lots for processing in a way that optimizes their utilization. The equipment agent's programmed goals are to maximize its overall utilization, respect the relative priority of lots, reduce setup or recipe changes, and optimize its batch size. This collaboration of agent interaction results in the scheduling of a lot on a particular piece of equipment, within a specified time window. Since the agents are autonomous rather than passive, this short-term scheduling interaction may occur in parallel for all lots in need of equipment.

Although agents of the same type are usually programmed with similar behavior, differentiation occurs to create specialized agents. In other words, all lots are not equal and therefore all lots do not exhibit the same behavior. Lots with different priorities are represented by different states of the agent, the different states following different processing rules. A lot that is participating in an engineering experiment must be processed differently than a production lot. Because the experimental lot is represented by an agent state with different behavioral rules, different processing is the natural result. This is an advantage over prior art MES systems, where the logic for handling normal vs. high priority vs. experimental lots is implemented in one piece of scheduling code containing a number of if-then conditions.

Another feature of the present system, because AEMS 120 is agent-based, is the ability to utilize the benefits of emergent behavior. Emergent behavior is collective system behavior that was not explicitly programmed into any of the individual agents. For example, when lot and equipment agents negotiate with each other in the scheduling application, they do not produce a deterministic result. Instead, the emergent behavior of the agents results in the efficient scheduling of lots on the available equipment.

The agents described above do not necessarily exist in a one-to-one correspondence with manufacturing domain entities, such as lots, equipment, etc. Instead, most domain entities are each represented by a group of agents. This facilitates the design of specialized objects that exhibit specialized behavior to support a single aspect of domain entity functionality.

Figure 2A:
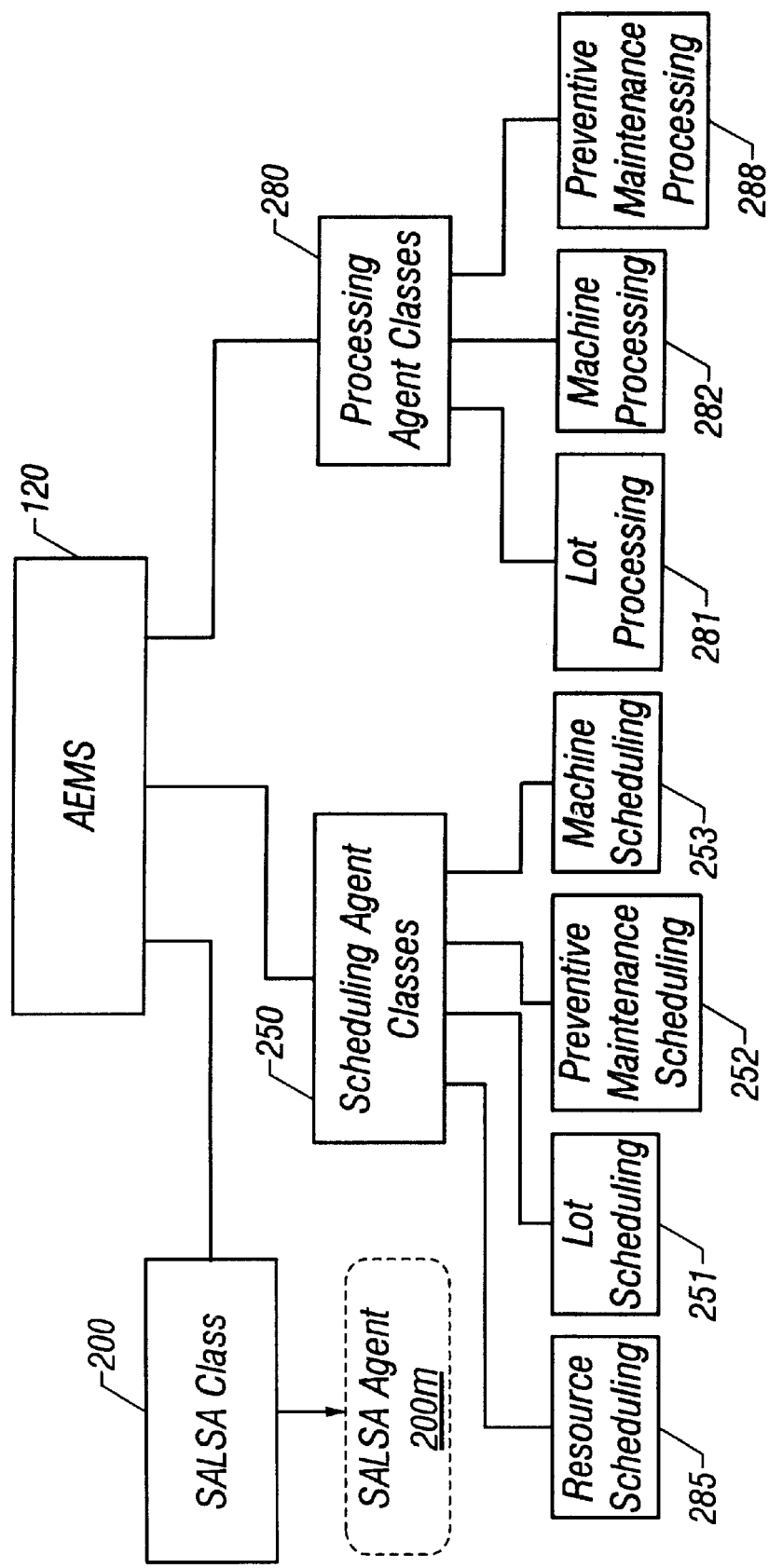
FIGS. 2A and 2B, is a block diagram depicting AEMS in more detail.

FIG. 2A is a block diagram depicting AEMS 120 in more detail. AEMS includes various classes, wherein instantiated objects of each class perform various tasks. The software agent classes include a starvation avoidance lot start agent class 200, one or more scheduling agent classes 250, and one or more processing agent classes 280. The scheduling agent classes 250 include one or more lot scheduling classes 251 whose objects perform scheduling tasks for lots, one or more preventive maintenance classes 252 whose objects schedule preventive maintenance on machines in the fab, and one or more machine scheduling classes 253 whose objects perform machine scheduling. The processing agent classes 280 include one or more lot processing classes 281 whose objects perform transport tasks for lots, one or more preventive maintenance processing classes 288 whose objects perform preventive maintenance and qualification tasks, and one or more machine processing classes 282 whose objects perform material processing tasks for machines in the fab.

Instantiated objects (hereinafter referred to as 200*m*) of the Starvation Avoidance Lot Start Agent (SALSA) class 200 control the scheduling of new lots into the fab so that Work-in-Process (WIP) is reduced without sacrificing throughput in a manufacturing process. The primary goal of a SALSA agent 200*m* is to start new lots into the manufacturing queue such that 1) new lots are started just in time to avoid idling (starving) the bottleneck, 2) to avoid starting new lots when they won't be processed anyway, and (3) achieve a desired product mix. In order to avoid starvation, a SALSA agent 200*m* controls the Work-In-Process (WIP)

available to bottleneck workstations by controlling the number of lots introduced into the fab and the timing of lot releases. In other words, the present invention affects starvation avoidance by controlling job release.

Figure 2B:
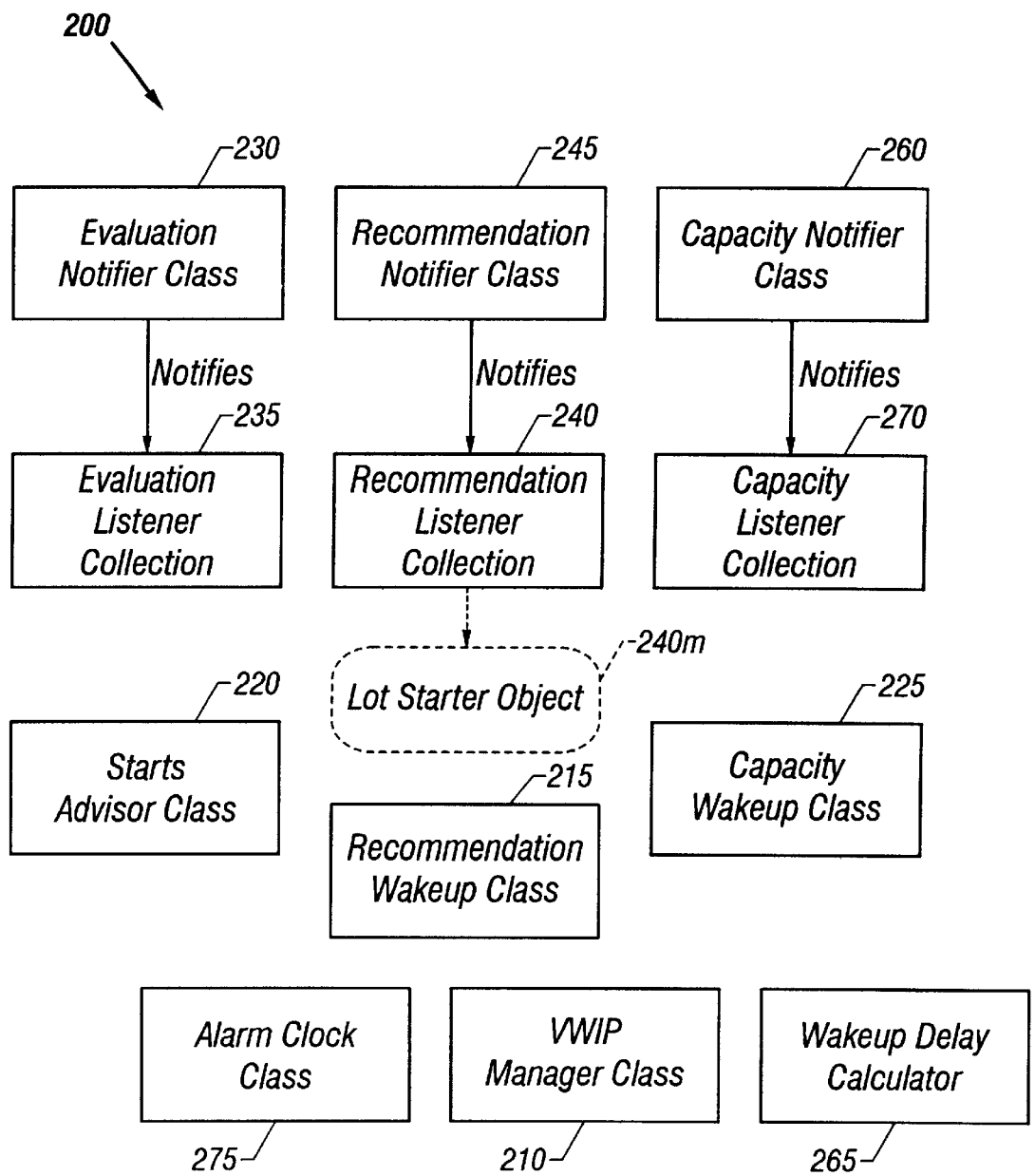

FIG. 2B illustrates various object classes 210, 215, 220, 225, 230, 235, 240, 245, 260, 260, 265, 270, 275 that a SALSA agent 200*m* invokes, in at least one embodiment, in order to control the introduction of new lots into the factory so as to avoid overburdening "bottleneck" manufacturing machines, while at the same time avoiding idle time ("starvation") at the bottleneck machines. A SALSA agent 200*m* is particularly useful in the context of semiconductor fabrication, because some features of wafer fabrication are not found in most other job shops. The photolithography process of wafer production requires the exposure of each of a multiple layers of photoresistive material through a mask. Because each layer of the wafer must be so exposed in the photolithography process, each lot of wafers repeatedly visits the photolithography workstation before it is completed. Since this equipment is very expensive, it is not overly abundant in the fab, and is therefore likely to be a bottleneck station. Thus, the special feature of wafer fabrication workflow that makes a SALSA agent 200*m* particularly useful is the repeated entry at a bottleneck workstation. A SALSA agent 200*m* focuses on the queue of work approaching the bottleneck workstation because such queue will on average be the biggest queue in the factory. When the term "work" is used in the context of "work approaching the bottleneck workstation" it means the amount of time that a bottleneck workstation will stay busy processing WIP that will reach the bottleneck in less time than new lot starts will reach the same bottleneck. A goal of at least one embodiment of a SALSA agent 200*m* is to allow high utilization rates of bottleneck machines while maintaining low levels of WIP.

A bottleneck is typically a machine that is heavily used within the fab. Due to this heavy utilization, a bottleneck workstation often includes more than one of the same type of machine. While a bottleneck workstation can sometimes include only a single machine, as used herein, the terms "bottleneck", "bottleneck station", "bottleneck machine", and "bottleneck workstation" are intended also to encompass a workstation that includes a plurality of machines, where the plurality of machines are all of the same machine type.

Figure 3:
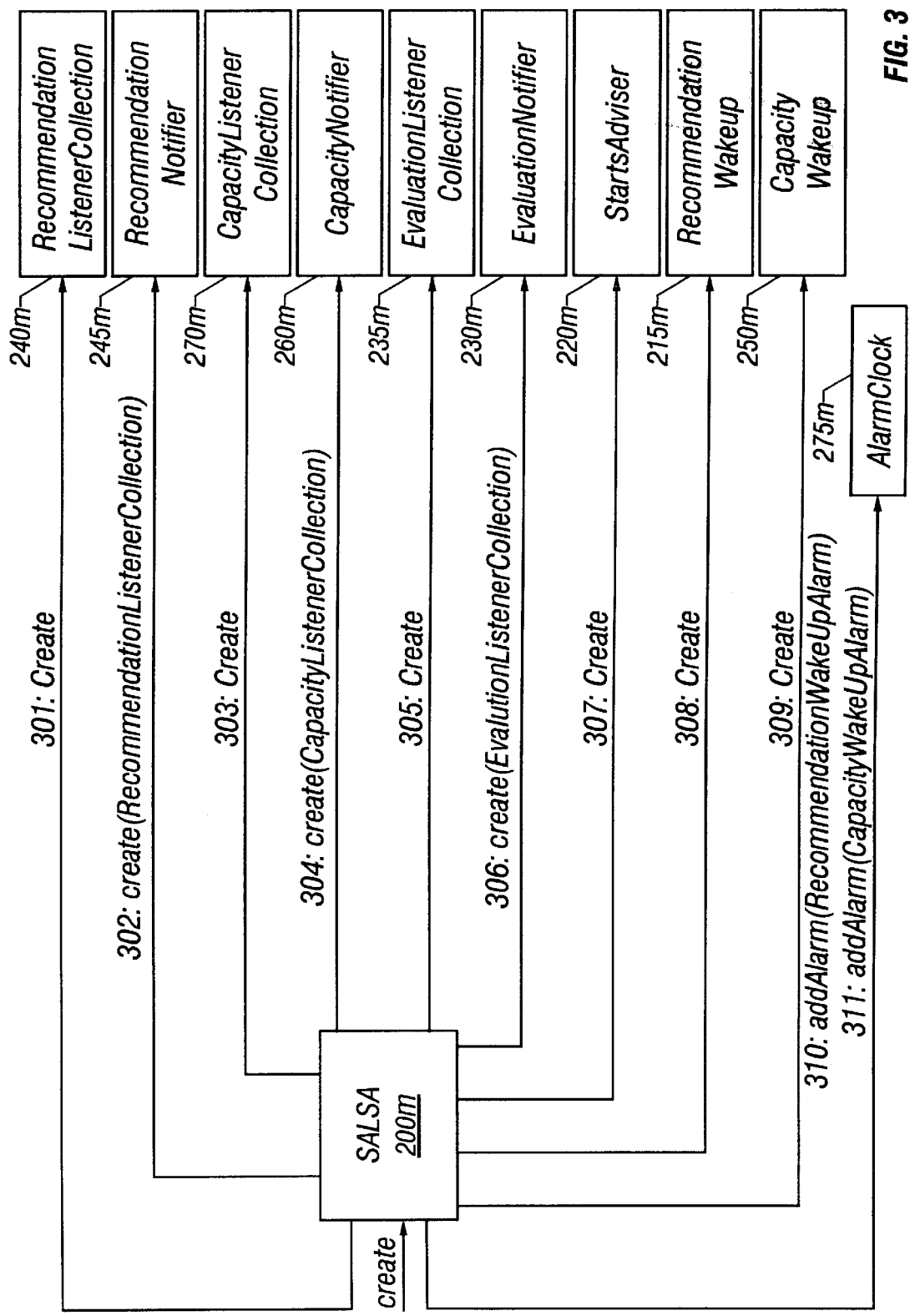
FIG. 3 is a collaboration diagram depicting Starvation Avoidance Lot Start Agent ("SALSA") creation processing.

FIG. 3 depicts the interaction of several classes that are directly or indirectly invoked by a SALSA agent 200*m*. Generally, a SALSA agent 200*m* determines which products should be started, and when, in order to prevent bottleneck starvation. In order to do this, the SALSA agent 200*m* monitors the inventory approaching bottleneck resources and releases new lots into the fab whenever this inventory falls below a safety level. The SALSA agent 200*m* monitors the WIP that is positioned to feed the bottleneck machines and only starts new lots just in time to ensure that the bottleneck machine is not starved. New lots are not started as long as there is sufficient WIP to feed each bottleneck. The SALSA agent 200*m* then becomes inactive, "or sleeps", for a calculated length of time during which the SALSA agent 200*m* has calculated that a starvation is unlikely to occur. At the end of this time, the SALSA agent 200*m* becomes active, or "wakes up", and repeats the process, calculating the work approaching each bottleneck station, and determining whether additional lots should be started in order to avoid future bottleneck starvation.

It should be understood that a "product" is any item, or group of items, manufactured at the manufacturing facility.

In at least one embodiment, a product is a specific microprocessor (such as Athlon™) or a specific computer memory (such as a flash memory). A product may be defined specifically, such as a particular type of microprocessor created using a particular version of a mask. In other embodiments, a product is a group of items with shared attributes, such as all microprocessors, all microprocessors of the same type (i.e., Athlon™), all memories; all flash memories, all microprocessors created using 0.25 micron process technology, all processors created using 0.18 micron technology, etc. The foregoing examples are for illustrative purposes only and should not be taken to be limiting.

FIGS. 2 and 3 illustrate that the SALSA agent 200*m* creates in operation 301 an instantiation 240*m* of the Recommendation Listener Collection class 240. In operation 302, the SALSA agent 200*m* creates a Recommendation Notifier object 245*m* and passes it the Recommendation Listener Collection object 240*m* that was created in operation 301. In this manner, the notifier object 245*m* is associated with one or more listener objects 240*m* that need to know when a recommendation for new lot starts has been made.

In operation 303 the SALSA agent 200*m* creates an instantiation 270*m* of the Capacity Listener Collection class 270. In operation 304, the SALSA agent 200*m* creates a Capacity Notifier object 260*m* and passes it the Capacity Listener Collection 270*m* that was created in operation 303. In this manner, the notifier object 260*m* is associated with one or more listener objects 270*m* that need to know when a capacity determination (underflow or overflow) has been made. A discussion of underflow and overflow processing is set forth below. In at least one embodiment, the Capacity Notifier object 260*m* notifies personnel that a particular capacity condition (i.e., projected underflow or overflow) is projected to occur during the current plan period.

In operation 305 the SALSA agent 200*m* creates an instantiation 235*m* of the Evaluation Listener Collection class 235. In operation 306, the SALSA agent 200*m* creates an Evaluation Notifier object 230*m* and passes it the Evaluation Listener Collection object 235*m* that was created in operation 305. In this manner, the notifier object 230*m* is associated with one or more listener objects 235*m* that need to know when an evaluation of whether or not to recommend new starts has occurred. In at least one embodiment, the Evaluation Listener Collection objects 235*m* log various indications concerning each evaluation cycle performed by the SALSA agent 200*m*, regardless of whether new lot starts are recommended during that evaluation cycle.

In operation 307 the SALSA agent 200*m* creates an instantiation 220*m* of the Starts Advisor class 220. The operation of the Starts Advisor object 220*m* is discussed in further detail below in connection with the discussion of FIG. 4.

In operation 308, the SALSA agent 200*m* creates an instantiation 215*m* of the Recommendation Wakeup class 215. The Recommendation Wakeup object 215*m*, in turn, instantiates a Recommendation Wakeup Listener object 217*m* (FIG. 4) and sets an alarm indicating when the newly instantiated Recommendation Wakeup Listener object 217*m* should be invoked. This alarm, the Recommendation WakeupAlarm, is passed back to the SALSA agent 200*m*. The invocation and operation of the Recommendation Wakeup Listener object 217*m* is discussed in further detail below in connection with the discussion of FIG. 4.

In operation 309, the SALSA agent 200*m* creates an instantiation 225*m* of the Capacity Wakeup class 225. The Capacity Wakeup object 225m, in turn, instantiates a Capacity Wakeup Listener object (not shown) and sets an alarm indicating when the newly instantiated Capacity Wakeup Listener object should be invoked.

In operations 310 and 311, the Recommendation WakeupAlarm and the Capacity WakeupAlarm, respectively, are sent to an instantiation 275m of the Alarm Clock class 275.

Figure 4:
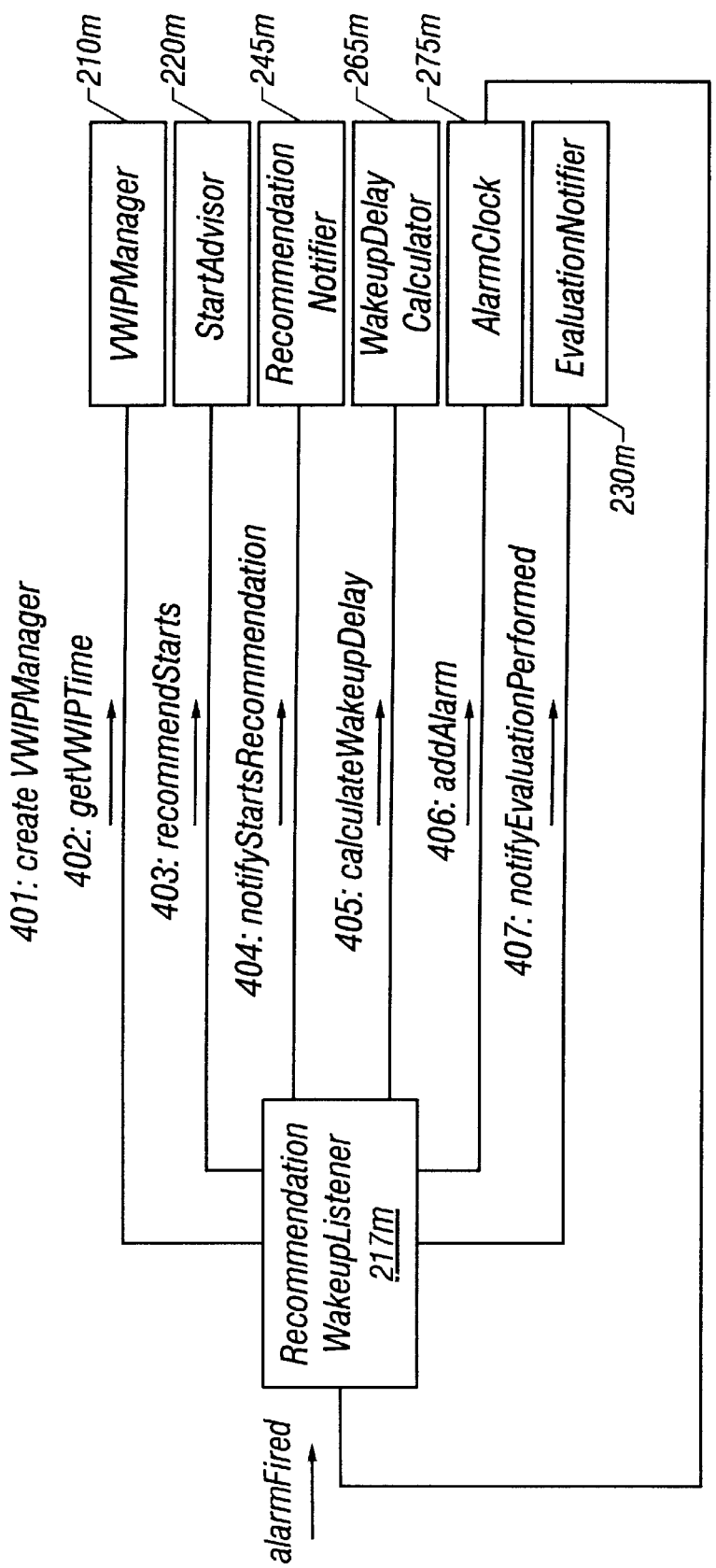
FIG. 4 is a collaboration diagram depicting the SALSA processing performed by a Recommendation Wakeup Listener object in response to an alarm.

FIG. 4 illustrates that, when an alarm is fired by the alarm clock, a Recommendation Wakeup Listener object 217m creates an instantiation 210m of the VWIP Manager object class 210 in operation 401 and retrieves information regarding virtual WIP from the instantiated VWIP Manager object 210m in operation 402. VWIP is a measure of how many time units it will take for one bottleneck station to process all of the WIP within its bottleneck segments, based on the lots currently at or expected to arrive at the bottleneck workstation within a given Lead Time and based on how many machines are available (not down) at the bottleneck station. The Starts Advisor object 220m determines whether the amount of WIP in the relevant "bottleneck segments" for each bottleneck station are sufficient to keep the bottleneck station occupied, and therefore avoid bottleneck starvation. As is explained in further detail below, the VWIP Manager object 210m determines the total Virtual WIP (VWIP) for all bottleneck segments, and then determines the delta VWIP, which is the difference between the actual VWIP for all bottleneck segments and the required VWIP necessary to prevent starvation for that particular bottleneck type. The VWIP Manager object 210m calculates VWIP and delta VWIP for one or more bottleneck stations to produce a collection of "bottleneck results." Further description of bottleneck segments, Lead Time, and the delta VWIP calculation are provided below.

FIG. 4 illustrates that, in operation 402, the Recommendation Wakeup Listener object 217m creates an instantiation 210m of the VWIP Manager class 210. In operation 402, the Recommendation Wakeup Listener object 217m initiates a "getVWIPTime" operation that invokes the VWIP Manager object 210m. The VWIP Manager object 210m performs processing as described below in connection with the discussion of FIGS. 5 and 7, and returns a collection of bottleneck results.

In operation 403, the Recommendation Wakeup Listener object 217m determines whether starts should be recommended in order to avoid bottleneck starvation. To do so, the Recommendation Wakeup Listener object 217m invokes the Starts Advisor object 220m that was created in operation 307 (FIG. 3), passing it the collection of bottleneck results and other parameters such as the number of starts planned for the starts period, the number of lots actually started so far during the plan period, and various other parameters such as minimum delta VWIP time and the maximum number of wafers that may be started at one time. Using this information, the Starts Advisor object 220m determines whether starts should be recommended in order to avoid bottleneck starvation. The Starts Advisor object 220m further determines how many lots to start, and from which products the new lot starts should be chosen.

If the Starts Advisor object 220m determines that starts are required, then the Recommendation Wakeup Listener object 217m performs operations 404 through 407. If not, then the Recommendation Wakeup Listener object 217m skips operation 404 and performs operations 405 through 407. The Starts Advisor object 220m determines that no starts are necessary when it determines, based on the bottleneck results provided by the VWIP Manager object 210m and other information provided by the Recommendation Wakeup Listener object 217m, that no bottlenecks are in danger of starvation. That is, the VWIP for none of the bottleneck stations will likely fall below the minimum acceptable VWIP level during the current evaluation cycle.

In operation 404 the Recommendation Wakeup Listener object 217m invokes the Recommendation Notifier object 245m to notify objects of the Recommendation Listener Collection 240 (FIG. 3) that lot starts have been recommended. In at least one embodiment, one member of the Recommendation Listener Collection is a Lot Starter object 240m. The Lot Starter object 240m operates, in at least one embodiment, to release the correct number of lots of the recommended product into the factory's Manufacturing Execution System (MES) 141 (FIG. 1).

In operation 405 the Recommendation Wakeup Listener object 217m calculates the wakeup delay by invoking the Wakeup Delay Calculator object 265m. In at least one embodiment, the Wakeup Delay Calculator object 265m determines how long the SALSA agent 200m should "sleep" before it runs another evaluation cycle. A wakeup delay alarm is created based on the wakeup delay. In operation 406, the wakeup alarm calculated in operation 405 is added to the Alarm Clock object 275m.

In operation 407, the Recommendation Wakeup Listener object 217m invokes the Evaluation Notifier object 230m, whether lot starts were recommended or not. Through this action, the Evaluation Notifier object 230m notifies the Evaluation Listener Collection objects 235m (FIG. 3) that an evaluation cycle has occurred.

Figure 7:
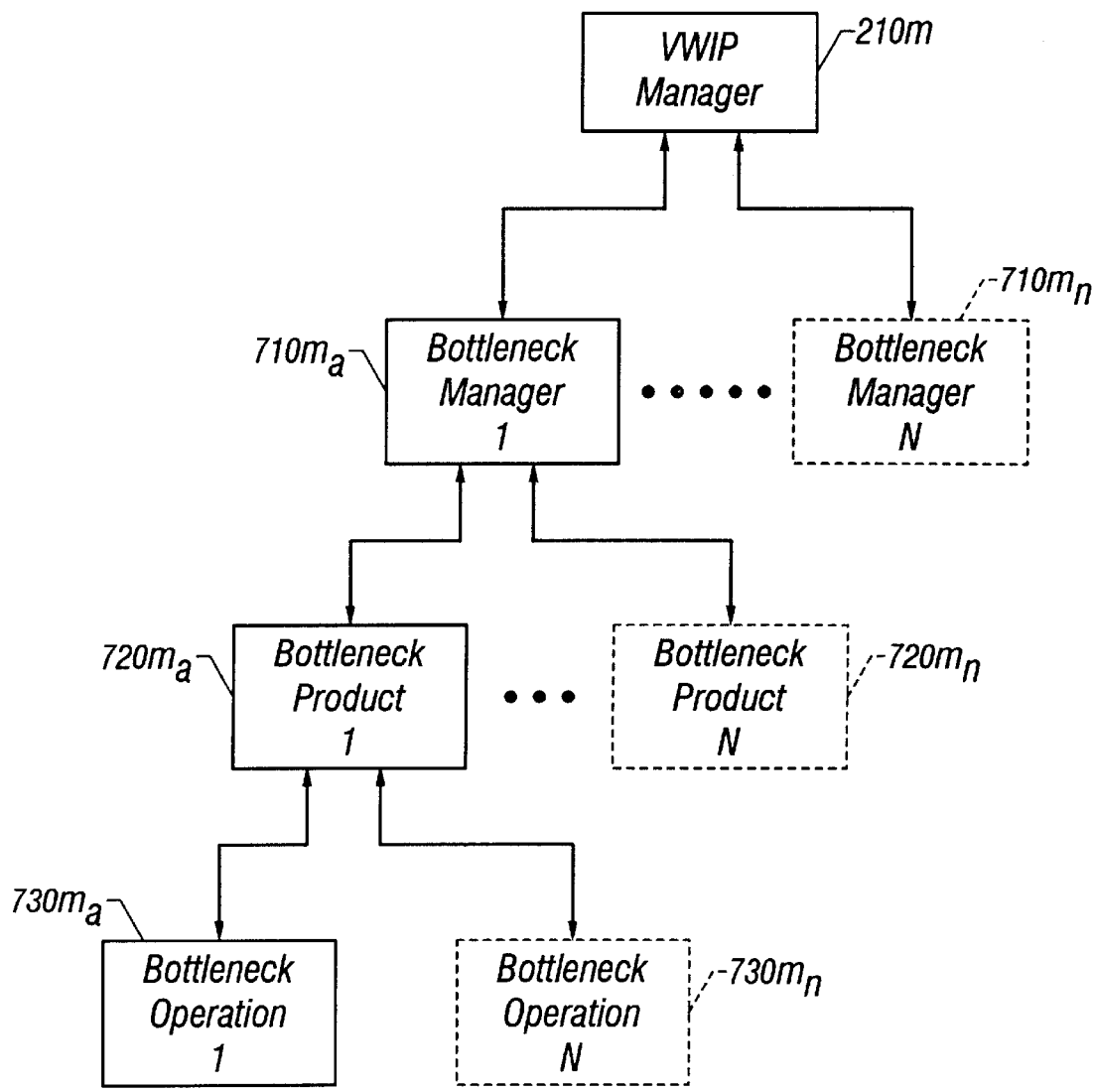
FIG. 7 is a block diagram depicting one embodiment of the VWIP manager object.

FIGS. 5 and 7 illustrate a VWIP Manager object 210m in more detail. FIG. 7 illustrates that the VWIP Manager object 210m has both a top-down and a bottom-up aspect. The VWIP Manager object 210m works in a bottom-up fashion to determine whether any bottleneck is in danger of starvation by determining each bottleneck station's delta VWIP. The top-down aspect exists because the creation of objects $710m_a$–$710 m_n$, $720m_a$–$720m_n$, $730m_a$–$730m_n$ is initiated by the VWIP Manager object 210m and continues with increasing specificity down a tree-type pattern of object invocations. In at least one embodiment, the SALSA agent 200m performs operations 510 through 595 in parallel for each bottleneck. In at least one alternative embodiment, the operations 510 through 595 are performed iteratively in order to process each bottleneck serially.

FIGS. 5 and 7 illustrate that, in operation 510, the VWIP Manager object 210m identifies a bottleneck station. FIG. 7 illustrates that the VWIP Manager object 210m creates a Bottleneck Manager object 710m for each bottleneck station in the fab. In at least one embodiment, the information regarding which fab machines constitute bottlenecks is retrieved from one of the Configurable Control Inputs 130 (FIG. 1). In alternative embodiments, the SALSA agent 200m itself determines which machines are bottlenecks.

FIG. 7 further illustrates that the top-down creation of objects is continued when each Bottleneck Manager object $710m_a$–$710m_n$ determines which products use the particular bottleneck machine type to which the Bottleneck Manager object $710m_a$–$710m_n$, respectively, corresponds. Based on this analysis, each Bottleneck Manager object 710m creates a collection of Bottleneck Products objects $720m_a$–$720m_n$, one for each product that uses the particular bottleneck station in its process flow.

Each Bottleneck Product object 720m represents a product $P_i$ that uses the bottleneck station in its manufacturing process. The top-down nature of the VWIP Manager object 210m is continued in the Bottleneck Product objects 720m$_a$–720m$_n$, which create one or more Bottleneck Operation objects 730m.

FIG. 7 illustrates that the Bottleneck Product object 720m instantiates a Bottleneck Operation object 730m for each operation in a "bottleneck segment." That is, the Bottleneck Product object 720m creates Bottleneck Operations objects 730m for each operation within the Lead Time, as discussed below, of each occurrence of the bottleneck station for that product. The set of operations whose WIP will reach a specific occurrence of the bottleneck in less time than new lots starts will reach the first occurrence of the bottleneck ("Lead Time") is called a "bottleneck segment." To understand this process, it is useful to understand that each manufacturing product P$_i$ has a manufacturing process consisting of a sequence of operations that must be performed in a prescribed order. Each such operation in the manufacturing sequence for product P$_i$ has an average Process Time and an average Queue Time to perform the operation. Each operation is also associated with a Machine Type that performs the operation. All of this information associated with a manufacturing product P$_i$ may be either calculated in AEMS 120 (FIG. 1) or may be received from the MES system 141 (FIG. 1). In addition, each operation may have a variable amount of WIP at a particular point in time. The Bottleneck Operation object 730m retrieves this WIP information from the Factory 110.

Returning to FIG. 5, the Lead Time L$_i$ to the first occurrence of the bottleneck station for product P$_i$ is calculated in operation 520. Assuming that new lots of manufacturing product P$_i$ released into the line will take Lead Time L$_i$ to reach the first occurrence of a bottleneck station, a bottleneck segment consists of the sequence of operations within Lead Time L$_i$ of a bottleneck occurrence. In order to determine which operations are within the Lead Time of each occurrence of the bottleneck for the product P$_i$, the Bottleneck Product object 720m initially determines the Lead Time to the first identified bottleneck in operation 520. Lead Time is an estimate of the time required for a job to travel from the beginning of the manufacturing process to the first occurrence of a bottleneck. Table 1, below, and FIG. 6 are presented to illustrate the Lead Time calculation performed by the Bottleneck Product objects 720m$_a$–720m$_n$ of FIG. 7.

TABLE 1

| Step | Machine Type | Queue Time | Process Time | Total Time | WIP Wafers |
|---|---|---|---|---|---|
| 1 | Sink | 160 | 40 | 200 | 10 |
| 2 | Furnace | 800 | 200 | 1000 | 20 |
| 3 | Stepper | 250 | 60 | 310 | 15 |
| 4 | Etcher | 200 | 50 | 250 | 25 |
| 5 | Implant | 200 | 50 | 250 | 15 |
| 6 | Sink | 300 | 70 | 370 | 20 |
| 7 | Furnace | 900 | 200 | 1100 | 15 |
| 8 | Etcher | 300 | 75 | 375 | 20 |

Figure 6:
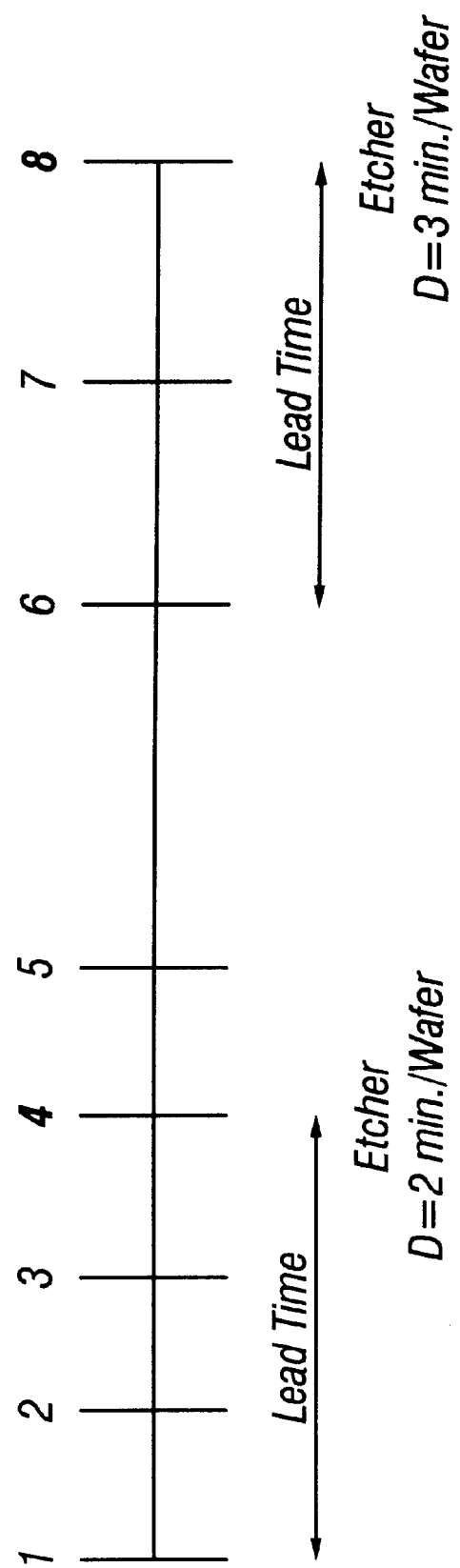
FIG. 6 is a chart depicting an exemplary sequence of operations for a product $P_i$.

Table 1 and FIG. 6 show a hypothetical sequence of manufacturing operations for a product P$_i$. Table 1 illustrates that Machine Type "Etcher" is a bottleneck in the manufacturing line for product P$_i$. FIG. 6 illustrates that the Etcher is used in Step 4 and Step 8 of the sequence of manufacturing operations for product P$_i$. The first occurrence of the bottleneck is at Step 4, so new lots must be processed in the manufacturing line through steps 1–3 before they become available for processing at Step 4 and thus become part of the WIP for the bottleneck at Step 4. To determine how long it will take before this happens, the Bottleneck Product object 720m adds up the total time that the product takes to pass through each of the operations preceding the first bottleneck operation. Total Time for each of steps 1–3 includes the time the product waits in the queue (referred to in Table 1 as "Queue Time") and the time it takes to process the product at the particular operation station (in this case, the Sink, Furnace, and Stepper, respectively). This latter time is referred to in Table 1 as "Process Time."

Each Bottleneck Product object 720m computes, in operation 520, the Lead Time L$_i$ for the first occurrence of the bottleneck for product P$_i$. For the above example, Table 1 illustrates that Total Time for Step 1 is 200 units of time, Step 2 takes 1000 units of time, and step 3 takes 310 units. The Lead Time L$_i$ in our example is then: L$_i$=200+1000+310=1510. Generalizing, the Lead Time L$_i$ for any product P$_i$ having a manufacturing process that consists of sequential steps numbered 1 through n is:

$$L_i = \sum_{s=1}^{N_i-1} T_{i,s},$$

where the first occurrence of the bottleneck for product P$_i$ is step N$_i$ and the Total Time to perform step s for product P$_i$ is T$_{i,s}$.

The Lead Time L$_i$ to the first occurrence of the bottleneck for product P$_i$ is further optimized by decreasing it by a configurable percentage. The Lead Time Adjustment Factor, L$_{AF}$, is used to decrease the Lead Time L$_i$ by a configurable percentage 130. This is helpful, for instance, when the average actual cycle time of the manufacturing process is known to be less than the sum of the step times T$_{i,s}$. Use of the L$_{AF}$ is particularly useful when the step times are "standards" or when step cycle times are calculated from theoretical processing times using the X-factors method (described below). The value of L$_{AF}$ is a configurable input 130 within the range: 0<L$_{AF}$≦1.0. When L$_{AF}$=1.0, the result is that the step times are not adjusted. The optimized Lead Time L$_i$ to the first occurrence of the bottleneck for product P$_i$ is thus calculated by the Bottleneck Product object 720m as follows:

$$L_i = L_{AF} * \sum_{s=1}^{N_i-1} T_{i,s},$$

where L$_{AF}$ is the lead time adjustment factor.

In order to perform the Lead Time L$_i$ calculation set forth above, the SALSA agent 200m uses values of step cycle times (T$_{i,s}$) from one of two sources. That is, the SALSA agent 200m can be configured to use either baseline cycle time (L$_O$) or an exponentially weighted moving average ("EWMA") of observed cycle times in calculating Lead Time L$_i$; each of the two sources is described below. The configuration selection is communicated to the SALSA agent 200m via an input value. The input value may be set by software (such as when a default value must be chosen). Ordinarily, however, the source of step cycle times is selected by a user through the Configurable Control Inputs 130. The SALSA agent 200m may be configured to use the baseline cycle times for an individual step or, in the alternative, an exponentially weighted moving average (EWMA) of observed cycle times for an individual step.

The baseline cycles times (L$_O$) for individual steps are either based on standards or are calculated from X-factors. Regarding the standards method, a SALSA agent 200m may be configured to use standard time figures that are provided by the factory 110. These standard time figures are determined by manufacturing personnel or manufacturing computing applications. Manufacturing personnel or computing applications periodically determine a standard process time ($PT_{i,s}$) and a standard queue time ($QT_{i,s}$) for each step in the manufacturing process. In a system that supports multiple products, a $PT_{i,s}$ and $QT_{i,s}$ values are determined for each step in the manufacturing process for each product. These standard times are typically developed through time studies on the manufacturing floor. Using the standards method, the total cycle time $T_{i,s}$ of the step s for product i is: $T_{i,s} = PT_{i,s} + QT_{i,s}$.

Regarding the X-factors method, a theoretical process time ($TPT_{i,s}$) of a manufacturing step s can be calculated for a particular product i based on the throughput rate for the machine performing the step s, and also based on product specifications for the product i. When the SALSA agent 200m is configured to calculate lead time using the X-factors method, the Bottleneck Product object 720m calculates the product theoretical process time ($PTPT_i$) for product i as the sum of $TPT_{i,s}$ for all $N_i$ steps of the product i's manufacturing process:

$$PTPT_i = \sum_{s=1}^{N_i} TPT_{i,s}$$

In addition to the theoretical process time ($PTPT_i$) of a product, a product also has a standard product cycle time ($SPCT_i$), which is the total elapsed time between starting the product at the first step and completing the last step of the manufacturing process. The ratio of the standard product cycle time, $SPCT_i$, to the theoretical cycle time, $PTPT_i$, of a product i is the X-factors for the product i:

$$X_i = SPCT_i / PTPT_i.$$

This X-factor $X_i$ can then be used to estimate the cycle time of a product at a step from the theoretical process time as follows:

$$T_{i,s} = X_i * TPT_{i,s}.$$

The third method of determining step cycle time is the exponentially weighted moving average (EWMA) of observed cycle time method. Using this method, the SALSA agent 200m calculates an average cycle time ($CT_{EWMA}$) for each unique combination of product, step, and lot priority based on observations of the cycle time as lots complete processing at the manufacturing step. Each lot is identified as a specific product and a specific priority. In one embodiment, for example, the priorities may consist of normal priority, expedited ("hot") priority, top ("rocket") priority, critical priority, or platinum priority. Cycle Time for a manufacturing step is the time elapsed between the completion of the previous step and the completion of the step for which the cycle is being computed. In the case of the first step in a product's manufacturing process, the cycle time is the time elapsed between lot creation and the completion of the step.

The EWMA approach is useful in more accurately calculating subsequent cycle times that reflect the dynamics of the factory and the reduced cycle times produced by the SALSA agent 200m. The cycle time as derived from one of the other two methods above (standards method and X-factors method) becomes inaccurate as the operation of the SALSA agent 200m reduces cycle times. An initial cycle time estimate, $CT_{EWMA,0}$, is generated from an estimate, $CT_{est}$, which is generated according to one of the other methods mentioned above (standards method or X-factors method). The Bottleneck Product object 720m initializes $CT_{EWMA,0}$ as follows:

$$CT_{EWMA,0} = CT_{est}$$

Thereafter, the estimated cycle time is adjusted based on an Exponentially Weighted Moving Average (EWMA) of observed cycle time. As lots complete processing at the manufacturing step, the SALSA agent 200m observes the cycle time and updates $CT_{EWMA}$ accordingly. The SALSA agent 200m uses the following formula to calculate $CT_{EWMA,i}$ from observation i of Cycle Time ($CT_{obs,i}$) and the previous value $CT_{EWMA,i-1}$:

$$CT_{EWMA,i} = \lambda * CT_{obs,i} + (1-\lambda) * CT_{EWMA,i-1}$$

for $0 < \lambda \leq 1$ and $i = 1, 2, 3 \ldots$, where $\lambda$ may be either a constant or a function.

The first bottleneck segment for any product $P_i$ is the sequence of operations up to and including operation $N_i$, the first occurrence of the bottleneck for that product. After the Bottleneck Product object 720m calculates the Lead Time to the first occurrence of the bottleneck for product $P_i$, the Bottleneck Product object 720m then identifies, in operation 530, all "bottleneck segments" in the manufacturing process for product $P_i$. The bottleneck can occur more than once for a product, since many products visit the same bottleneck station more than once during the manufacturing process. If the product $P_i$ has $B_i$ occurrences of this bottleneck, then the product has $B_i$ bottleneck segments. The identification of all bottleneck segments for product $P_i$ is necessary because the SALSA agent 200m determines when to start new lots by calculating how long the WIP currently in the bottleneck segments will keep the bottleneck busy. The SALSA agent 200m maintains sufficient WIP so the bottleneck will not become idle before new lot starts reach the first occurrence of the bottleneck in $L_i$ time units.

The Bottleneck Product object 720m uses the Lead Time $L_i$ for the first occurrence of the bottleneck to determine which operations are within each bottleneck segment. As stated above, the first bottleneck segment for any product $P_i$ is the sequence of operations up to and including operation $N_i$, which is the first occurrence of the bottleneck for the product. In our example, the bottleneck segment for the first occurrence of the bottleneck at Step 4 would include operations 1 through 4. Regarding other bottleneck segments, Table 1 shows that, in our example, the next occurrence after the first bottleneck occurs at Step 8. Thus, a bottleneck segment exists for Step 8. The bottleneck segment should include Step 8 and all steps preceding Step 8 that will complete within the Lead Time $L_i$ that has been calculated by the Bottleneck Product object 720m in operation 520. Using $L_i = 1510$ from our example above, Step 7, with a total time of 1100, as well as Step 6, with a total time of 370, would both complete in less than 1510 time units. Thus, Steps 6 and 7 fall within the Lead Time preceding Step 8 and therefore fall within the Step 8 bottleneck segment. This process is performed by a Bottleneck Product object 720m_a–720m_n for every occurrence of the bottleneck in the manufacturing sequence of product $P_i$. For our example, bottleneck segment 1 ($g_1$) includes Steps 1 through 4, and bottleneck segment 2 ($g_2$) includes Steps 6 through 8.

The Bottleneck Product object 720m can be configured to use either baseline cycle times or EWMA cycle times as the step cycle time for the steps considered for inclusion in all segments beyond the first bottleneck occurrence. As is explained above, baseline cycle times may be derived either from standards or X-factors. In the example set forth above, the step cycle times used to determine which steps fall within the lead time $L_i$ leading up to Step 8 can be configured to be either baseline or EWMA step cycle times. Segment step cycle times can be configured independently from step cycle times used to configure lead time ($L_i$). The Bottleneck Product object 720m via an input value. The input value may be set by software (such as when a default value must be chosen). Ordinarily, however, the source of segment step cycle times is selected by a user through the Configurable Control Inputs 130. The Bottleneck Product object 720m may be configured to use the baseline cycle times, or in the alternative, an exponentially weighted moving average (EWMA) of observed cycle times for an individual step.

In the final tier of the top-down aspect of the VWIP Manager class 210, the Bottleneck Product object 720m creates an instantiation of the Bottleneck Operation class 730 for each operation that falls within bottleneck segments for the particular product $P_i$. In at least one embodiment, this is performed in parallel for each of the Bottleneck Product object's 720m bottleneck operations.

It is in the VWIP Manager's 210m lower-most logical tier, the Bottleneck Operation object 730m, that the bottom-up processing begins. Each Bottleneck Operation object 730m generates information concerning its current WIP value. Specifically, each Bottleneck Operation object 730m generates a value representing $W_{i,k}$, which is the WIP for operation k for a particular product $P_i$. This WIP value is retrieved from the Factory 110 (FIG. 1) and is passed by the Bottleneck Operation object 730m back up the hierarchy of objects until it reaches the VWIP Manager 210m.

In operation 540, the Bottleneck Product object 720m uses the $W_{i,k}$ values to then calculate the virtual WIP (VWIP) for each $P_i$ bottleneck segment, g, by summing the WIP for each operation in the bottleneck segment. For purposes of describing this function with an equation, let $W_{i,k}$ represent the WIP for each operation k in the bottleneck segment g for a particular product $P_i$. The variable k will take on the values $Q_i$ through $V_i$, where Q represents the first operation k in the segment g and V represents the last operation k in the segment g. For instance, segment 1 in our example includes Steps 1 ($Q_i$) through 4 ($V_i$) so k equals 1–4 in the following equation:

$$\text{Segment } WIP_g = \sum_{k=Q_i}^{V_i} w_{i,k}.$$

In the example set forth above, $WIP_1$ is the sum of WIP at operations 1 through 4, which is 10+20+15+25=70 wafers. $WIP_2$ is the sum of WIP at operations 6 through 8, which is 20+15+20=55 wafers. For machine types that operate on lots rather than wafers, lots are summed instead of wafers. For batch machine types which process multiple lots at the same time, the number of lots are summed and divided by the average batch size for the machine type.

Figure 5A:
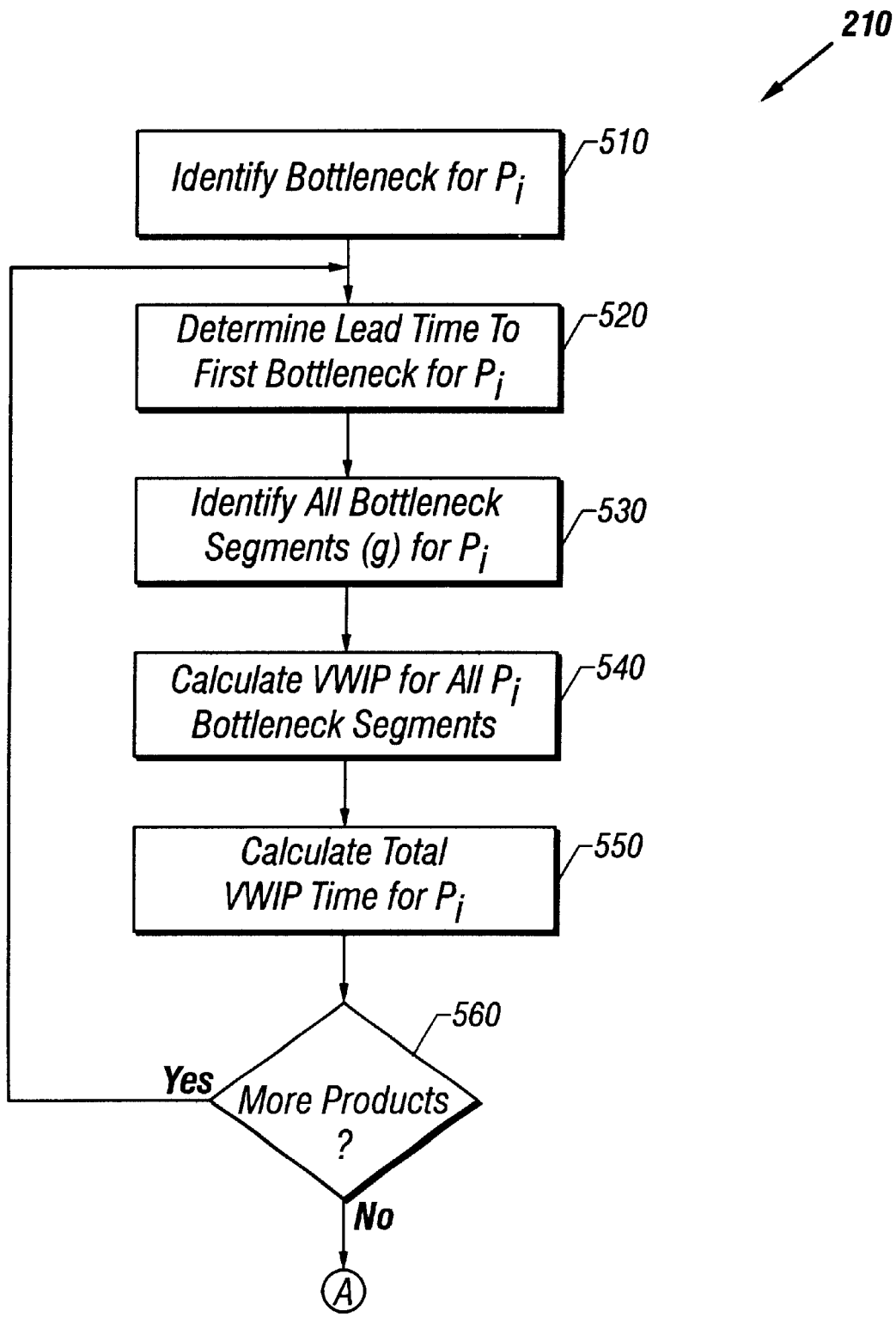
FIG. 5A and FIG. 5B, is a flow chart depicting the processing of a Virtual WIP Manager object in more detail.

FIG. 5A illustrates that, after the Bottleneck Product object 720m determines the segment WIP for each bottleneck segment g for product $P_i$, it calculates, in operation 550, the Virtual WIP (VWIP) $V_{i,g}$ time for each segment. VWIP is a measure of how many time units it will take for the bottleneck station to process all of the WIP within its bottleneck segment, based on the lots currently at or expected to arrive at the bottleneck workstation within a given Lead Time and based on how many machines are operating at the bottleneck station.

$V_{i,g}$ is therefore a calculation of the time that M bottleneck machines will take to consume the WIP in segment g.

FIG. 6 indicates that the etcher used in Step 4 of a hypothetical sequence of manufacturing operations for a product $P_i$ consumes wafers at the rate (D) of 2 minutes/wafer. In contrast, the etcher used in Step 8 consumes wafers at the rate (D) of 3 minutes/wafer. Assume that bottleneck segment g for product $P_i$ has a bottleneck wafer consumption rate $D_{i,g}$ at its specific bottleneck occurrence g and the bottleneck consists of M machines that can perform the operation task. The Bottleneck Product object 720m calculates the Virtual WIP time $V_{i,g}$ for segment g consisting of operations $Q_i$ through $V_i$ with WIP $W_{i,k}$ at operation k as:

$$V_{i,g} = \frac{D_{i,g}}{M} * \sum_{k=Q_i}^{V_i} w_{i,k}.$$

$V_{i,g}$ is the time that M bottleneck machines will take to consume the WIP in segment g. In the above example, assuming M=2 machines, the Bottleneck Product object 720m would calculate the VWIP for the two bottleneck segments $g_1$ and $g_2$ as follows:

Segment 1 VWIP for $P_i(V_{i,1})$=2 min/wafer*(70 wafers)=140 min/2=70.

Segment 2 VWIP for $P_i(V_{i,2})$=3 min/wafer*(55 wafers)=165 min/2=82.5.

The bottleneck consumption rate $D_{i,g}$ is typically the same as the processing time for the bottleneck step but in some cases $D_{i,g}$ is not equal to the processing time. In FIG. 6, for example, the wafer processing time for the etcher in Step 4 is 2 minutes/wafer, identical to the consumption rate (D) of 2 minutes/wafer. However, some types of bottleneck machines like steppers, consume wafers at a faster rate than they process them. These types of machines operate similar to a conveyor belt with multiple processing stations. If the machine has four processing stations and the wafer spends 2 minutes at each processing station, then each wafer spends 8 minutes of processing time in the machine. But the wafer clears the first processing station in 2 minutes so the machine consumes wafers at the rate of 2 minutes/wafer. Therefore, the value of $D_{i,g}$ is always the consumption rate of the bottleneck rather than the processing time for the bottleneck step.

At least one embodiment of the Bottleneck Operation object 730m can be configured to take lots on hold into account when calculating the Virtual WIP time $V_{i,g}$ for a segment. If a Bottleneck Operation object 730m is not configured to take into account lots that have been placed on hold, then lots on hold are simply ignored. In such case, when the SALSA agent 200m calculates $W_{i,k}$, which is the total WIP for product $P_i$ at operation k, lots that are currently on hold are included in the VWIP $V_{i,g}$ for segment g.

If a Bottleneck Operation object 730m is configured to take lots on hold into account when calculating the VWIP for a bottleneck segment, the Bottleneck Operation object 730m considers the projected hold release time for the lot. The hold release time, $T_{HR}$, is the projected time that a lot will be released from hold. The time that a lot on hold will take to reach the next bottleneck occurrence is the sum of the remaining "on hold" time (H) and the time (R) that it will take the lot to reach the bottleneck after it is released from hold. In such case, H=$T_{HR}$−Current Time. If the sum of H+R is less than or equal to $L_i$, then the lot should be included in the VWIP for a bottleneck segment. If, on the other hand, the sum of H+R is greater than $L_i$, the lot should be ignored in the VWIP calculation for the bottleneck segment.

In addition to lots on hold, the Bottleneck Product object 720m also takes into account, in at least one embodiment, the effect of overlapping bottleneck segments when calculating the VWIP $V_{i,g}$ for segment g. If the time between two occurrences of a bottleneck is less than time $L_i$, the bottleneck segments overlap. When segments overlap, one or more operations occur in multiple bottleneck segments. Since the WIP in such overlapping operations will pass through the bottleneck station more than once during the time $L_i$, the WIP in each of these operations is included in the WIP calculation for every segment in which they occur.

Figure 8:
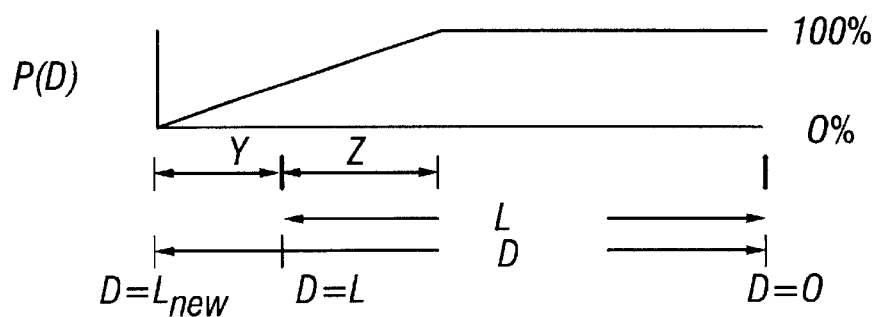
FIG. 8 illustrates at least one embodiment of a linear probability function used to weight WIP within a bottleneck segment.

FIG. 8 illustrates that, in at least one embodiment, the Bottleneck Product object 720m weights the VWIP at the leading edge of a bottleneck segment. In the prior art, WIP just inside the leading edge (starting step) of a bottleneck segment is weighted with 100% probability of occurring, while WIP just outside the leading edge of the bottleneck segment is weighted with 0% probability of occurring. In contrast, at least one embodiment of the Bottleneck Product object 720m weights the VWIP approaching the leading edge of a bottleneck segment according to a simple linear probability function. WIP farther from the bottleneck is weighted with a lower probability and WIP closer to the bottleneck is weighted with a higher probability. This provides a smooth transition of VWIP near the lead time of the bottleneck segment instead of an abrupt change.

To facilitate the weighting of VWIP within a bottleneck segment, two configurable controls 130, Y and Z, provide input to the Bottleneck Product object 720m. The controls Y, Z have values that are positive real numbers between 0.0 and 1.0. In at least one embodiment, the default values for both the Y and Z controls are 0.0.

The Y control indicates a percentage of the segment length (adjusted Lead Time $L_i$) that extends the segment length $L_i$ to add a tail to the leading edge (first step). The original segment length, $L_i$, plus the added tail length ($L_i$*Y) is referred to as the extended Lead Time, $L_{new}$. The extended Lead Time $L_{new}$ is calculated by applying the Y control (sometimes referred to as the SALSA Percent Segment Tail) to the Lead Time for the first bottleneck: $L_{new}=(1+Y)*L_i$. WIP within the "tail" extension of the leading edge is weighted less than 100%.

The Z control is a percentage of the segment length (adjusted Lead Time $L_i$) that defines the distance from the leading edge to the point within the segment length where WIP is weighted 100%. WIP inside the segment that also falls within the segment indicated by the Z control is weighted less than 100%. The Z control is sometimes referred to as the SALSA Segment Percent Lead Edge.

FIG. 8 illustrates the portions of a bottleneck segment indicated by the Y and Z controls, along with the corresponding probability graph P(D). L is the length of time represented by the adjusted Lead Time $L_i$. Y represents the "tail" portion of the extended lead time, $L_{new}$. Z represents the portion of the adjusted Lead Time $L_i$ that is assigned a probability of less than 100%. D is the Delta Time measured from the Bottleneck. For instance, D=0 at the bottleneck step and D=$L_i$ at the leading edge of the adjusted segment. D=$L_{new}$ at the leading edge of the extended Lead Time.

The VWIP Manager object 210m calculates the extended Lead Time $L_{new}$ by adding Y% of the Lead Time $L_i$ to the Lead Time $L_i$: $L_{new}=(1+Y)*L_i$. The VWIP Manager object 210m next calculates the largest Delta Time $L_{100}$ where the probability is 100%: $L_{100}=(1-Z) * L_i$. In other words, the VWIP Manager object 210m calculates $L_{100}$ by subtracting Z% of the Lead Time $L_i$ from the Lead Time $L_i$.

For each bottleneck segment, the VWIP Manager object 210m locates all the steps that fall within the extended Lead Time $L_{new}$ of each bottleneck occurrence. Because it includes the tail, the extended Lead Time $L_{new}$ is larger than the adjusted Lead Time $L_i$. The WIP at all of the steps that fall within the extended Lead Time $L_{new}$ are included in the VWIP calculation.

For each step within the segment defined by $L_{new}$, the VWIP Manager object 210m determines the distance D between that particular step and the bottleneck that terminate the segment. The VWIP Manager object 210m calculates the probability function P(D) for the step based on the value of D relative to $L_{100}$ as follows:

$$P(D)=1-[(D-L_{100})/((X+Y)*L_i)], \text{ for } D>L_{100}, \text{ and}$$

$$P(D)=1.0, \text{ for } D \leq L_{100}.$$

As a final operation in the weighting of WIP within a bottleneck segment, the Bottleneck Product object 720m multiplies the WIP at the step by P(D) to compute the adjusted WIP, $WIP_{adj}$, for the step. The Bottleneck Product object 720m calculates the $WIP_{adj}$ for the step as: $WIP_{adj}$=WIP*P(D). The Bottleneck Product object 720m uses $WIP_{adj}$ as the WIP value $W_{i,k}$ for the step in the calculation of the segment VWIP, $V_{i,g}$. One should note that, when Y=0 and Z=0, the Bottleneck Product object 720m calculates an unweighted VWIP value. In such case, the Bottleneck Product object 720m does not divide by zero when computing P(D). Instead, P(D)=1.0 when the values of Y and Z are zero.

Table 1.1 illustrates the weighting of WIP within a bottleneck segment. The "Total Time" values reflected in Table 1.1 are based on the hypothetical sequence of manufacturing operations for a product $P_i$ as previously set forth in Table 1.

TABLE 1.1

| Step | Total Time | D | WIP (Wafers) | P(D) | $WIP_{adj}$ | Comments |
|---|---|---|---|---|---|---|
| 1 | 200 | 1510 | 10 | 0.71 | 7.14 | Segment 1 Weighted because Z = 0.10 and D > L100 |
| 2 | 1000 | 1310 | 20 | 1 | 20 | Segment 1 |
| 3 | 310 | 310 | 15 | 1 | 15 | Segment 1 |
| 4 | 250 | | 25 | 1 | 25 | Segment 1 Bottleneck $D_{i,g}$ = 2 minutes per wafer |
| 5 | 250 | 1720 | 15 | 0.32 | 4.75 | Included in Segment 2 because Y = 0.15 and D < Lnew |
| 6 | 370 | 1470 | 20 | 0.79 | 15.80 | Segment 2 Weighted because Z = 0.10 and D > L100 |

TABLE 1.1-continued

| Step | Total Time | D | WIP (Wafers) | P(D) | WIP$_{adj}$ | Comments |
|---|---|---|---|---|---|---|
| 7 | 1100 | 1100 | 15 | 1 | 15 | Segment 2 |
| 8 | 375 | | 20 | 1 | 20 | Segment 2 Bottleneck $D_{i,g} = 3$ minutes per wafer |

Note: Assume Y = 0.15 and Z = 0.10
$L_{new}$ = (1 + Y)*$L_i$ = 1736.5
$L_{100}$ = (1 − Z)*$L_i$ = 1359

Total WIP ($W_{i,k}$) for segment 1 = (7.14 + 20 + 15 + 25) = 67.14
Total WIP ($W_{i,k}$) for segment 2 = (4.75 + 15.8 + 15 + 20) = 55.55

Assume M = 2 Machines

| Segment | $D_{i,g}$ | M | $W_{i,k}$ | $V_{i,g}$ |
|---|---|---|---|---|
| 1 | 2 | 2 | 67.14 | 67.14 |
| 2 | 3 | 2 | 55.55 | 83.33 |

Total VWIP time $V_i$ = (67.14 + 83.33) = 150.47

FIG. 5A illustrates that, in operation 550, the Bottleneck Product object 720*m* calculates the total VWIP time for all bottleneck segments for product $P_i$. The total VWIP time $V_i$ for product $P_i$ with $B_i$ bottleneck segments each containing virtual WIP $V_{i,g}$ is:

$$V_i = \sum_{g=1}^{B_i} v_{i,g}$$

In the example above, assuming M=2 machines, the Bottleneck Product object 720*m* would calculate $V_i$ for product $P_i$ as 70 min.+82.5 min.=152.5 min. This total VWIP time $V_i$ represents the time necessary to process available WIP for product $P_i$ at the bottleneck station before additional WIP arrives.

In connection with total VWIP time, $V_i$, for a product, one skilled in the art will recognize that VWIP passes from segment to segment as it moves through the manufacturing line. Lots may temporarily be excluded from the VWIP calculation as they leave a segment and get processed at steps that are not included in the next bottleneck segment. If the lots reappear in bottleneck segments later in the manufacturing line, they will again be included in the total VWIP Time, $V_i$, for the product. Generally, lots in segments located near the beginning of the manufacturing line will remain a part of VWIP for a much longer time than lots in segments located near the end of the manufacturing line, since lots in segments near the end of the manufacturing line will soon drop out of VWIP entirely and will not return. To anticipate the need for lot starts in advance of bottleneck starvation, it is thus desirable, in at least one embodiment, to apply a lower weight to lots located in segments near the end of the manufacturing line.

To weight a segment's VWIP based on the segment's location in the manufacturing line, the Bottleneck Product object 720*m* receives information concerning a particular product's manufacturing route. The Bottleneck Product object 720*m* determines how many bottleneck segments are in the manufacturing route for the product, with the first segment being denoted as Segment 1 and the ultimate segment being denoted as Segment N. The Bottleneck Product object 720*m* also receives as an input 130 a configurable control value, $W_L$. $W_L$ is the weight factor to be applied to the last segment, Segment N. In at least one embodiment, the desired weight of Step 1 is 1.0 and the desired weight of Step N is less than one. The value of $W_L$ provides the specific weight to be applied to Step N, the value of $W_L$ being between 0 and 1.0. When the value of $W_L$ is 1.0, all segments are weighted equally at 100%.

Different products may have differing numbers of bottleneck segments N. In order to apply the same weight (denoted by the value of $W_L$) for the endpoint segment (Segment N) for each product regardless of N, the Bottleneck Product object 720*m* defines β as follows for each product with N total segments:

$$\beta = W_L^{(1/N-1)}.$$

The Bottleneck Product object 720*m* then uses the value of β to calculate the weight to be applied to the segment. The following function W(s) defines the weight to be applied to VWIP in segment number s:

$$W(s) = \beta^{(s-1)}.$$

Accordingly, in an embodiment that weights Segment 1 with a value of 1.0, the value of the weight function at the endpoints is: W(1)=1.0 and W(N)=$W_L$. After calculating the total VWIP for segment s, VWIP$_s$, the VWIP$_s$ is multiplied by the weight W(s) to compute the weighted segment VWIP, Wgt_VWIP$_s$: Wgt_VWIP$_s$=VWIP$_s$*W(s), for s=1, 2, . . . , N. The VWIP Manager object 210*m* applies the segment weight, W(s), to the total VWIP$_s$ for a segment AFTER all other VWIP modifications have been applied. For instance, the VWIP probability function described above is first applied against the WIP at individual steps in the segment to calculate the total segment VWIP$_s$. Only then is the weighted segment VWIP, Wgt_VWIP$_s$, calculated for the segment.

If configured to weight segment WIP based on segment location, the VWIP Manager object 210*m* performs modified processing in operation 550. To calculate the total VWIP$_p$ for a product p, the VWIP Manager object 210*m* sums the weighted VWIP for all of segments 1 through N:

$$VWIP_p = V_i = \sum_{s=1}^{N} \text{Wgt\_VWIP}_s.$$

Table 1.2 illustrates the calculation of the sum of weighted VWIP for segments 1 and 2, where segment WIP is weighted based on segment location. The "Total Time" values reflected in Table 1.2 are based on the hypothetical sequence of manufacturing operations for a product Pi as previously set forth in Table 1.

TABLE 1.2

| Step | Total Time | D | WIP (Wafers) | P(D) | WIP$_{adj}$ | Comments |
|---|---|---|---|---|---|---|
| 1 | 200 | 1510 | 10 | 0.71 | 7.14 | Segment 1 Weighted because Z = 0.10 and D > L100 |
| 2 | 1000 | 1310 | 20 | 1 | 20 | Segment 1 |
| 3 | 310 | 310 | 15 | 1 | 15 | Segment 1 |
| 4 | 250 | | 25 | 1 | 25 | Segment 1 Bottleneck $D_{i,g}$ = 2 minutes per wafer |
| 5 | 250 | 1720 | 15 | 0.32 | 4.75 | Included in Segment 2 because Y = 0.15 and D < Lnew |
| 6 | 370 | 1470 | 20 | 0.79 | 15.80 | Segment 2 Weighted because Z = 0.10 and D > L100 |

TABLE 1.2-continued

| Step | Total Time | D | WIP (Wafers) | P(D) | WIP$_{adj}$ | Comments |
|---|---|---|---|---|---|---|
| 7 | 1100 | 1100 | 15 | 1 | 15 | Segment 2 |
| 8 | 375 | | 20 | 1 | 20 | Segment 2 Bottleneck $D_{i,g}$ = 3 minutes per wafer |

Note: Assume Y = 0.15 and Z = 0.10
$L_{new}$ = (1 + Y)*$L_i$ = 1736.5
$L_{100}$ = (1 − Z)*$L_i$ = 1359

Total WIP ($W_{i,k}$) for segment 1 = (7.14 + 20 + 15 + 25) = 67.14
Total WIP ($W_{i,k}$) for segment 2 = (4.75 + 15.8 + 15 + 20) = 55.55

Assume M = 2 Machines, $W_L$ = 0.9 and N = 2 segments
B = $W_L^{(1/N − 1)}$ = $0.9^{(1/(2 − 1))}$ = $0.9^1$ = 0.9

| Segment(s) | $D_{i,g}$ | M | $W_{i,k}$ | $V_{i,g}$ = VWIP$_s$ | W(s) = $B^{(s − 1)}$ | Wgt_VWIP$_s$ |
|---|---|---|---|---|---|---|
| 1 | 2 | 2 | 67.14 | 67.14 | 1 | 67.14 |
| 2 | 3 | 2 | 55.55 | 83.33 | 0.9 | 75.00 |

Total VWIP time VWIP$_p$ = $V_i$ = (67.14 + 75.00) = 142.14

At least one embodiment of a SALSA agent 200m supports multiple products that may use the same bottleneck station. FIG. 5 illustrates that, in such embodiment, the VWIP Manager object 210 determines in operation 560 whether additional products utilize the bottleneck station. If so, then the VWIP Manager object 210m repeats operations 520 through 550, performing the $V_i$ calculation for all products so that it will then be able to calculate the total VWIP time $W_v$ for the bottleneck.

If it is determined in operation 560 that there are no additional products that use the bottleneck station, then the VWIP Manager object 210m calculates that total VWIP time for the bottleneck. Using the results of the above calculations, the VWIP Manager object 210m calculates, in operation 570, how long it will take a bottleneck station, v, to starve, given all WIP at the bottleneck station, not just WIP for a particular product $P_i$. The VWIP Manager object 210m performs this task by calculating the total VWIP time $W_v$ for the bottleneck v. $W_v$ is the time the bottleneck machine(s) will take to consume all of the WIP in every segment for every product. After $V_i$ has been calculated for each product p that uses the bottleneck, as described above, then the VWIP Manager object 210m calculates $W_v$ for the bottleneck according to the equation:

$$W_v = \sum_{i=1}^{p} V_i,$$

where there are a total of p products with total Virtual WIP $V_i$ for product $P_i$.

As a performance enhancement, at least one embodiment of the VWIP Manager object 210m uses an exponentially weighted moving average on the total VWIP $W_v$ for each bottleneck in order to eliminate noise. The EWMA is applied to total VWIP after segment weighting. The VWIP Manager object 210m applies segment weights to the WIP in each segment while calculating total VWIP for the bottleneck, as described above. Then, the EWMA is applied to total VWIP $W_v$ for the bottleneck v. For example, assume that VWIP$_1$ is the total VWIP $W_v$ for a bottleneck station as measured at time i. In order to calculate the EWMA_VWIP$_i$, the VWIP Manager object 210m must keep track of the previous EWMA value for the bottleneck, EWMA_VWIP$_{i−1}$, which was calculated at time i−1. The VWIP Manager object 210m also receives as an input a control value, λ, which is the weight value that is applied to the current observation. Using these values, the VWIP Manager object 210m calculates the new EWMA for total VWIP for the bottleneck as:

$$EWMA\_VWIP_i = \lambda^* VWIP_i + (1-\lambda)^* EWMA\_VWIP_{i-1}.$$

The resulting value, EWMA_VWIP$_i$, is then used, rather than VWIP$_i$, by the VWIP Manager object 210m in subsequent calculations. For instance, the VWIP Manager object 210m uses EWMA_VWIP$_i$ in the calculation of delta VWIP values. One skilled in the art will recognize that a lambda control value of λ=1.0 produces the same behavior as no EWMA. That is, EWMA_VWIPi is always equal to the current value of total VWIP when λ=1.0.

In an embodiment that supports multiple bottleneck stations (machine types), the processing illustrated in FIG. 5 and described above is repeated in order to calculate the total VWIP for each additional bottleneck station. The SALSA agent 200m calculates a separate total VWIP time for each bottleneck station.

In at least one embodiment of the SALSA agent 200m, additional processing is necessary in order to determine the estimated cycle time (queue time+process time) that is used by the Bottleneck Product object 720m to compute the Lead Time $L_i$ in operation 520. While cycle time figures, labeled as "Total Time," have been placed in Table 1 for convenience of example, they may come from several sources.

The total cycle time $T_{i,s}$ for a particular product i at step s in the manufacturing process is referred to herein as a step cycle time. In at least one embodiment, the SALSA agent 200m can be configured to use step cycle times, in determining lead times, that are derived using any of the three following methods: standards method, X-factor method, or exponentially weighted moving average method.

When using step cycle times derived by the exponentially weighted moving average method, outlier detection is employed in order to prevent anomalous observations from affecting $CT_{EWMA}$. In production, a lot may be placed on hold for an extended period of time for engineering evaluation. If this lot is eventually released and processed, it will likely have a much higher cycle time that does not reflect any change in the expected cycle time for the operation. This type of observation is detected and discarded—it is not included in $CT_{EWMA}$.

Outlier detection uses a moving range calculation to estimate the standard deviation of cycle time. For each cycle time observation, the moving range observation $MR_{obs,i}$ is calculated as the absolute value of the difference from the previous observation:

$$MR_{obs,i} = |CT_{obs,i} - CT_{obs,i-1}| \text{ for } i=2,3,\ldots \text{ (not defined for } i=1\text{)}.$$

These observations of the moving range are used to calculate the average moving range, $MR_{avg}$ for each unique product/route/operation. Let $N_r$ represent the cumulative number of observations of the average moving range. Initially, for each product/route/operation, $N_r=0$ and $MR_{avg,1}=0$.

As observations of cycle time and moving range occur, $MR_{avg}$ and $N_r$ are updated:

$$MR_{avg,i} = (N_r{}^*MR_{avg,i-1}+MR_i)/(N_r+1) \text{ for } i=2,\ldots$$

$$N_r=N_r+1.$$

Outlier detection is not applied until the number of observations exceed a configurable number that provides sufficient observations of the moving range to provide a high confidence in $MR_{avg}$. The standard deviation of the cycle time for a product/route/operation can then be estimated by σ:

$$\sigma = MR_{avg} * 2.66/3$$

CTSigma, a configurable control input 130, defines the number of standard deviations for outlier detection. Before updating $CT_{EWMA}$ with a new observation $CT_{obs}$, SALSA compares the value $CT_{obs}$ against the upper and lower limits for outlier detection of the product/route/operation. An observation is used for the next $CT_{EWMA}$ calculation if it is within the following range, otherwise it is discarded:

$$(CT_{EWMA} - CTSigma * \sigma) < CT_{obs} < (CT_{EWMA} + CTSigma * \sigma).$$

$CT_{EWMA}$ may be used to calculate the product Lead Time to the first bottleneck for the purpose of determining which operations fall within a Lead Time prior to each bottleneck occurrence. As discussed below, the VWIP Manager object 210*m* may also use the $CT_{EWMA}$ as the estimated cycle time when calculating the current Virtual WIP time for a bottleneck.

Figure 5B:
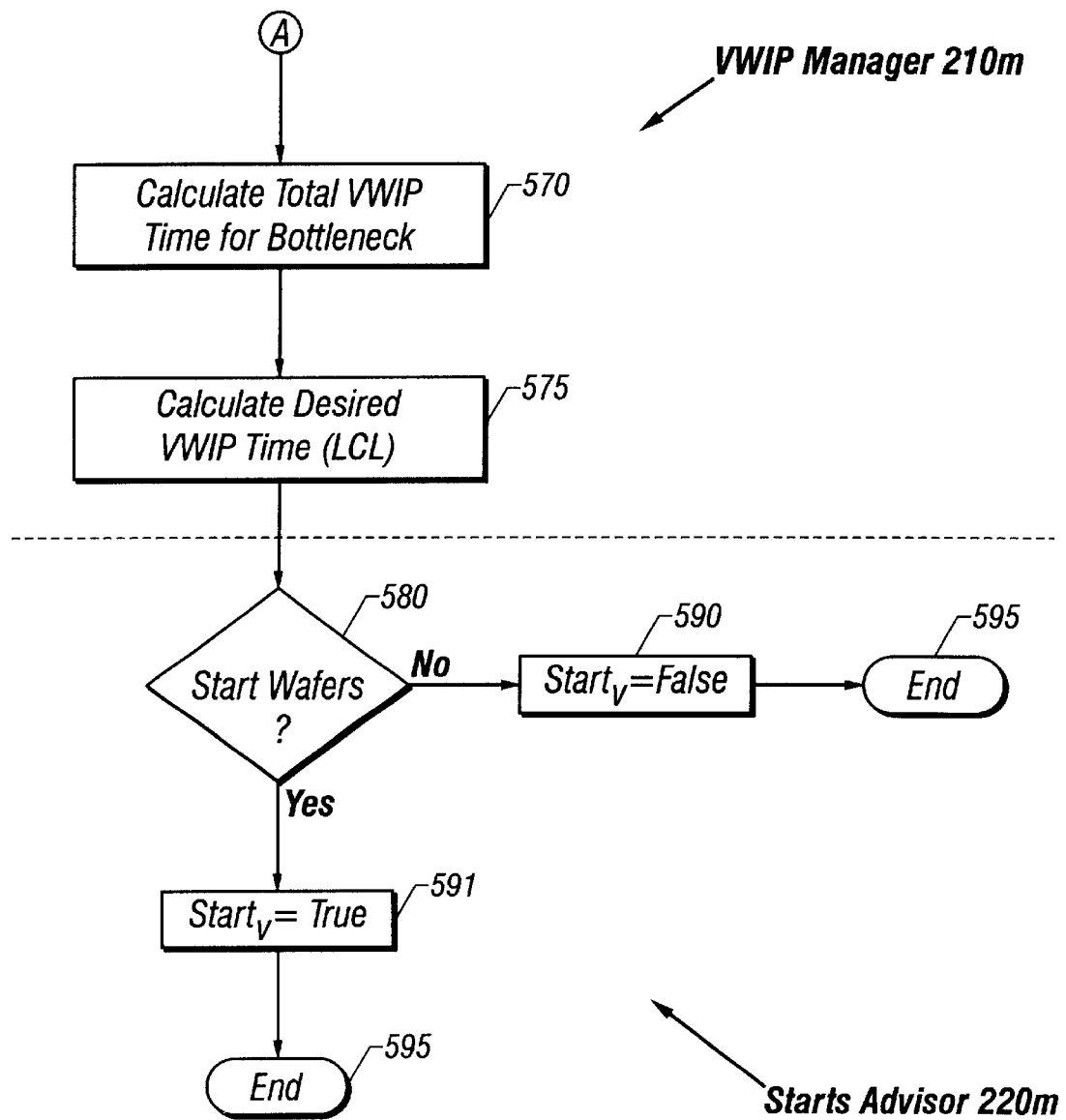

FIG. 5B illustrates that, in operation 575, the Bottleneck Manager object 710*m* computes the Lower Control Limit (LCL). The LCL is a number representing the lowest desirable VWIP time that can exist at a bottleneck station without risking starvation. The Bottleneck Manager object 710*m* calculates the LCL for each bottleneck from two values, the weighted Lead Time ($L_w$) and the safety factor (SF): LCL= SF*$L_w$. To calculate the LCL, the Bottleneck Manager object 710*m* uses $L_w$ as estimate of the time it will take for newly released lots to reach the first occurrence of a bottleneck station. The Bottleneck Manager object 710*m* then multiplies $L_w$ by a Safety Factor SF to calculate the Lower Control Limit (LCL) for Virtual WIP time. The SF is a configurable control input 130 (FIG. 1) that is determined from simulation or by observing VWIP. At least one embodiment provides for a separate configurable Safety Factor (SF) value for each bottleneck and therefore each bottleneck may have a different LCL. The Bottleneck Manager object 710*m* calculates LCL for a bottleneck as: LCL=SF* $L_w$.

The weighted Lead Time $L_w$ is a weighted average of the lead times for all products that will be started in the current starts period. Preparatory to the calculation of $L_w$, the Lead Time for each product is calculated by the Bottleneck Product object 720*m*, as described above, and passed up to the Bottleneck Manager object 710*m*. The product Lead Times are then weighted by product start percentage as detailed below.

$L_w$ is the weighted Lead Time of all products with planned starts in the current week. The processing of the SALSA agent 200*m* has the effect of reducing cycle times as time passes. However, the lowest desirable Virtual WIP time LCL should stay constant over time unless manufacturing personnel or computer applications choose to change it. Therefore the cycle time estimates used to compute $L_w$ are not based on the changing EWMA of observed cycle time but rather on the initial estimate of a product's Lead Time $L_i$. The initial estimate of $L_i$ is computed as the sum of the initial estimated cycle time, $CT_{est}$, for all operations prior to the bottleneck operation. Assume that the manufacturing process for product $P_i$ consists of sequential steps numbered from 1 to n. Let the first occurrence of the bottleneck for product $P_i$ be step $N_i$ and assume the Total Time to complete step s for product $P_i$ is $T_{i,s}$. The Lead Time $L_i$ for product $P_i$ is then:

$$L_i = L_{AF} * \sum_{s=1}^{N_i-1} T_{i,s},$$

where $L_{AF}$ is the lead time adjustment factor, which is described above.

When computing $L_w$, the Bottleneck Manager object 710*m* uses a lead time of $L_i$ for product $P_i$. The value of $L_w$ is re-computed at the start of each starts period based on the new values of $F_i$, the fractional starts for product $P_i$ in the new week. If the planned lot starts for product $P_i$ in the current starts period is $S_i$, then the fractional starts $F_i$ for the product $P_i$ when a total of p products will be started is:

$$F_i = \frac{S_i}{\sum_{j=1}^{p} S_j}.$$

The value of the weighted Lead Time $L_w$ is re-computed based on the new values of $F_i$, the fractional starts for product $P_i$ each time the start plan changes or a new starts period begins. The weighted Lead Time $L_w$ for p products with planned starts in the current week is:

$$L_w = \sum_{i=1}^{p} L_i * F_i.$$

In order to weight these Lead Times, the Bottleneck Manager object 710*m* receives from the Factory 110 (FIG. 1) information concerning planned lot starts for the current week. By way of example, assume starts are planned for p products in the current week. The different products may use the bottleneck station at different times in their sequence of manufacturing operations, thus having different lead times. In calculating $L_w$, the lead time for each product is multiplied by the fraction that the product will constitute of total planned product starts for the week.

In at least one embodiment, the SALSA agent 200*m* computes $L_i$ using the standards method or X-factor method as described earlier. In an alternative embodiment, the current EWMA cycle times for all operations preceding the first bottleneck occurrence are summed to generate an initial estimate of product lead time. The choice of whether to use standards, X-factors, or the observed EWMA cycle time is configurable, and is the result of a choice implemented with one of the configurable control inputs 130 (FIG. 1).

The Bottleneck Manager object 710*m* calculates the Delta Virtual WIP time $W_d$ for each bottleneck station. The Bottleneck Manager object 710*m* determines $W_d$ by calculating the difference between the Lower Control Limit (LCL) and the current Virtual WIP time $W_v$. The VWIP Manager object 210*m* determines the Delta VWIP time $W_d$ as follows: $W_d = W_v - LCL$. The delta VWIP time for a bottleneck station is the VWIP in excess of the Lower Control Limit. Delta VWIP time is therefore the amount of time remaining until the bottleneck station begins to risk starvation.

FIG. 5B illustrates that, after the virtual WIP for each bottleneck i and LCL have been calculated, the Starts Advisor object 220*m* determines in operation 580 whether additional wafers need to be started. As is discussed above, the Delta Virtual WIP time $W_d$ (also referred to herein as $DV_i$) for a bottleneck i is calculated for each bottleneck by calculating the different between the LCL and the current virtual WIP time $W_v$ (also referred to herein as $VWIP_i$) for the bottleneck. Using these calculated $DV_i$ values, the Starts Advisor object 220m selects the bottleneck $B_i$ with the lowest $DV_i$ value.

For the bottleneck with the lowest $DV_i$ value, the Starts Advisor object 220m calculates the number of wafers necessary to bring this bottleneck's Delta $VWIP_1$ to a value exceeding a minimum Delta VWIP value. In some cases, the bottleneck with the lowest $DV_i$ value will nonetheless have a Delta $VWIP_i$ value that exceeds the minimum Delta VWIP value. This situation is referred to as "Case A" in the following table.

In a second situation, "Case B," lots must be started in order to increase the Delta VWIP for the bottleneck with the lowest $DV_i$ value. The delta $VWIP_i$ value for the bottleneck with the lowest $DV_i$ value must be increased to a value exceeding the minimum Delta VWIP. Thus, Table 2 below indicates that the Starts Advisor object 220m will recommend wafer starts if $DV_i$ for the bottleneck with the lowest $DV_i$ value is less than or equal to a configurable parameter 130, MinimumDeltaVWIP. The Starts Advisor object 220m initializes the value of Starts to zero at the beginning of each evaluation, and then calculates a value for Starts as indicated in Table 2.

TABLE 2

Case A: $DV_i$ > MinimumDeltaVWIP

Strategy: no lots to start
Action: Starts = 0
Case B: $DV_i \leq$ MinimumDeltaVWIP Strategy: Start batches of B lots, if possible,
until $DV_i$ > minimuDeltaVWIP or
until restriction condition reached
Action:
(1) Compute WaferStarts = B*(WafersPerLot)
(2) if WaferStarts > $RW_T$ then WaferStarts = $RW_T$
(3) Starts = Starts + WaferStarts
(4) Determine what product(s) to start for WaferStarts for bottleneck BN
(5) $DV_i = DV_i$ + (consumption time of WaferStarts at product's first bottleneck)
    Note: recalculate $DV_i$ for all bottlenecks using each bottleneck's applicable consumption time
(6) if Starts $\geq$ MaxStarts then done for ALL bottlenecks, ELSE
(7) if $DV_i \leq$ minimum Delta VWIP then return to step (1) to start another batch, ELSE
(8) if $DV_i$ > minimum Delta VWIP then done with this bottleneck Regarding the nomenclature "B" and "WafersPerLot" used in Table 2, each is a configurable parameter 130. When new wafers are started they are started in batches of B lots, where B is a configurable number 130. The number of wafers per lot (WafersPerLot) is also configurable input 130.

As Table 2 indicates, when recommending the number of wafers to start, the Starts Advisor object 220m is constrained by certain restriction conditions. The Starts Advisor object 220m is constrained in the total number of wafers it can start during one evaluation period by two factors: (a) the remaining wafers ($RW_T$) of Planned Starts for the current starts period that have not already been started, and (b) a configurable control parameter 130, MaxStarts, that specifies the maximum number of wafers that can be started during one iteration of the SALSA agent 200m. Regarding the remaining wafers, the SALSA agent 200m calculates the $RW_T$ as the difference between the period-to-date total planned wafer starts and period-to-date total actual wafer starts. If there are a total of p products of Planned Starts and each product $P_i$ has $S_i$ planned wafer starts and $R_i$ actual wafer starts, then RWT is calculated as:

$$RW_T = \sum_{i=1}^{p} (S_i - R_i)$$

Table 2 illustrates that, for Case B, the Starts Advisor object 220m executes a processing loop in an attempt to start one batch of B lots at a time until $DV_i$>minimuDeltaVWIP for the bottleneck with the smallest $DV_i$ value (such bottleneck is hereinafter referred to as "BN"). One skilled in the art will recognize that the operation s addressed in the following discussion need not necessarily be performed in the order shown in order to retain the functionality described.

Table 2 illustrates that, in operation (1), the Starts Advisor object 220m computes WaferStarts, the number of wafers to be started (i.e., the number of wafers in a batch), based on the number of lots in a batch (B) and the number of wafers per lot.

In keeping with constraint (a) discussed above, the Starts Advisor object 220m determines in operation (2) whether the computed WaferStarts value exceeds the remaining number of wafers for the plan period. If so, the value of WaferStarts is reduced to reflect the value of $RW_T$.

As stated above, the Starts value is initialized to zero at the beginning of each evaluation period. Table 2 reflects that, in operation (3), the Starts Advisor object 220m increases the Starts value by the value of WaferStarts. Thus, for each iteration of the processing loop indicated in Table 2 for Case B, Starts is incremented to reflect additional wafers (unless $RW_T$=0) that are recommended to be started.

In operation (4), the Starts Advisor object 220m determines which products to start, now that it has already determined how many wafers to start (WaferStarts) for bottleneck BN. The operation of determining which products to start is discussed in further detail below.

In operation (5), the Starts Advisor object 220m adjusts the VWIP for each bottleneck after selecting the product to start. For each bottleneck that processes the selected product, the selected product will increase the bottleneck's VWIP. The Starts Advisor object 220m performs this calculation by re-calculating the $DV_i$ (Delta Virtual VWIP time) for each bottleneck i that processes the selected bottleneck such that $DV_i=DV_i$ plus the consumption time of the number of wafers recommended at the first bottleneck occurrence.

Table 2.1 sets forth an exemplary calculation of the VWIP adjustment set forth in operation (5) of Table 2.

TABLE 2.1

Assume B = 6 lots per batch and WafersPerLot = 25 wafers per lot.
In operation (1), WaferStarts = B*(WafersPerLot) = 6*25 = 150 wafers
In operation (2), assume remaining wafers starts ($RW_T$) > 150 wafers, thus WaferStarts is unchanged
In operation (3), assume previous Starts = 0,
thus Starts = 0 + WaferStarts = 150
In operation (4), assume product P is chosen to start all 150 wafers
In operation (5), calculate consumption time of 150 wafers of product $P_i$
In Figure 6, product P has a consumption rate $D_{i,g}$ = 2 minutes per wafer at the first "etcher" bottleneck occurrence at step 4.
When 150 wafers are released into the manufacturing line, they will immediately become part of bottleneck segment 1.
The virtual WIP that will be added to segment 1 is derived by the formula on line 12 of page 22, substituting WaferStarts as the additional WIP in segment 1:
$V_{i,g} = (D_{i,g}/M) *$ WaferStarts
Assume M = 2 machines.
Then consumption time for 150 WaferStarts at the first bottleneck TABLE 2.1-continued occurrence is:
Consumption Time = (2/2) * 150 = 150 minutes:
Thus operation (5) increases the delta VWIP (DV$_i$) for this bottleneck by 150 minutes:
DV$_i$ = DV$_i$ + 150

In operation (6), the Starts Advisor object 220m determines whether the second constraint condition has occurred. That is, the Starts Advisor object 220m determines whether the recommended starts meet or exceed the maximum allowable starts for an evaluation period. If so, then the processing loop is exited.

Operation (7) is performed if operation (6) evaluates to false. In operation (7), an additional iteration of the processing loop is entered if the Delta Virtual WIP for any bottleneck BN is still less than or equal to the minimum Delta VWIP value. Note that a different bottleneck may now have the lowest delta VWIP.

Operation (8) is also performed if operation (6) evaluates to false. In operation (8), processing for all bottlenecks is determined to be complete if the Delta Virtual WIP for every bottleneck is greater than the minimum Delta VWIP value.

In sum, the Starts Advisor object 220m calculates the number of wafers to start for the bottleneck with the minimum DV$_i$ and adjusts the DV$_i$ for all bottlenecks affected by the product started. The Starts Advisor object 220m then determines if any bottlenecks still have a DV$_i$ value that is less than the minimum Delta VWIP. If so, the Starts Advisor object 220m selects the new bottleneck BN and repeats the processing loop indicated in "Case B" of Table 2 until the new bottleneck BN is satisfied (that is, until DV$_i$ for the new bottleneck>minimum Delta VWIP). This process continues until all bottlenecks have an adjusted DV$_i$ that exceeds the minimum Delta VWIP. The process will, however, halt prematurely if Plan Starts is greater than or equal to Max-Starts or if RW$_T$ equals 0.

FIG. 4 illustrates that, after the Starts Advisor object 220m has completed its processing for all bottlenecks, the Recommendation Wakeup Listener object 217m invokes the Wakeup Delay Calculator object 265m in operation 405, then calculates the time at which the SALSA agent 200m should next run. This calculation is designed so that the SALSA agent 200m will "wake up" and run another evaluation cycle just when the bottleneck with the least Delta VWIP is projected to start starving, i.e., when it's DV$_i$=0. Such calculation is based, in part, on the observation that, for each bottleneck i, DV$_i$ represents the estimated time it will take to consume the bottleneck's available WIP. To ensure that no bottleneck will starve, the wakeup value is set to a time that reflects the amount of time that should lapse before the SALSA agent 200m runs a new evaluation cycle. The Wakeup Delay Calculator object 265m sets the time to wakeup as:

Wakeup=min(DV$_i$) for i=1, . . . , N where N=the number of bottlenecks.

Wakeup is thus set to the lowest (i.e., the "min" function) Delta VWIP for all bottlenecks. This sets Wakeup to the DV$_i$ value for the bottleneck that appears to be in the most danger of starving. If Starts≧MaxStarts, then the Starts Advisor object 220m sets the Wakeup value to the value of a parameter, MinimumWakeupDelay, instead of using the minimum value of DV$_i$. MinimumWakeupDelay is the minimum time that the SALSA agent 200m must delay after starting the maximum number of wafers. This value is a configurable input 130 and is based, in at least one embodiment, on determined throughput values for the maximum number of wafers.

Regarding which products to start, a more detailed discussion of the processing indicated in operation (4) of Table 2 is in order. As indicated above, the Starts Advisor object 220m identifies, in operations (1) through (3) indicated in Table 2, the need to start a batch of WaferStarts wafers to feed bottleneck BN. In operation (4), the Starts Advisor object 220m determines which product(s) should be started to fulfill that need. In so doing, the Starts Advisor object 220m attempts to start products in a manner that roughly approximates the fractional start ratio F$_i$ for each product P$_i$, where the fractional start ratio is based on the number of planned starts for each product. Maintaining the fractional percentage is important because the weighted Lead Time L$_w$ is calculated based on F$_i$. Maintaining the fractional start ratio allows L$_w$ to be more accurate.

In order to determine which product to start, the Starts Advisor object 220m first determines the proportion A$_i$ of each product P$_i$ that has been started in the current week. A$_i$ is the proportion of Actual Starts versus Planned Starts for the product P$_i$. If there are p products with planned starts of S$_i$ and actual period-to-date starts R$_i$ for each product P$_i$, then:

$$A_i = \frac{R_i}{S_i}.$$

After calculating A$_i$ for each product in the current week, the Starts Advisor object 220m then selects the product P$_i$, from among the products with A$_i$<1.0 that use a starving bottleneck, having the minimum A$_i$ value. The Starts Advisor object 220m starts lots of this selected product based on a value, SR$_i$. SR$_i$ is a value indicating the remaining wafer starts for the product that have been planned for the current plan period but have not yet been started. SR$_i$ is the difference between planned wafer starts S$_i$ and actual period-to-date wafer starts SR$_i$ for the product:

$$SR_i = S_i - R_i.$$

The Starts Advisor object 220m calculates SR$_i$ for each product that uses the selected bottleneck BN.

Once the Starts Advisor object 220m has selected a product with the minimum A$_i$ value and has determined that product's SR$_i$, it performs further processing in order to determine whether other products should be started in the new batch. In this processing, C represents the number of wafers needed to fill the batch. Initially, C=WaferStarts. In the processing loop indicated in Table 3, below, lots of products are selected until an entire batch of lots has been selected. In Case 1, only lots of the selected product P$_i$ are needed, because SR$_i$ for that product is greater than or equal to C. However, in Case 2 SR$_i$ is less than C. Therefore, in Case 2, lots of additional products must be selected in order to fill an entire batch.

Table 3

Case 1: $SR_i \geq C$

Situation: Remaining starts for product $P_i$ fulfill the wafers needed for the rest of the batch
Actions:
(1) Start C wafers of the product $P_i$ (uses BN with min $A_i < 1$)
(2) Increase the count of actual starts for product $P_i$
    $R_i = R_i + C$
(3) Decrease the remaining starts for product $P_i$ using the new $R_i$
    $SR_i = S_i - R_i$
(4) Recalculate $A_i$ for product $P_i$ using the new $R_i$
(5) Since there are no more wafers to start the process is complete Case 2: $SR_i < C$ Situation: Remaining starts for product $P_i$ are less than wafers needed for the rest of the batch.
Actions:
(1) Start $SR_i$ wafers of the product $P_i$ (uses BN with min $A_i < 1$)
(2) Increase the count of actual starts for product $P_i$
    $R_i = R_1 + SR_i$
(3) Decrease the remaining starts for product $P_i$ using the new $R_i$
    $SR_i = S_i - R_i$    (result is $SR_i = 0$)
(4) Recalculate $A_i$ (now $A_i = 1.0$) for product $P_i$ using the new $R_i$
(5) Reduce C to calculate the remaining wafers to start
    $C = C - SR_i$
(6) Determine which new product $P_i$ now meets the criteria:
    $P_i$ uses BN and has the minimum $A_i < 1.0$
(7) Calculate remaining starts for the new product $P_i$
    $SR_i = S_i - R_i$
(8) Return to Case 1 or Case 2 based on new C and $SR_i$ values

---

Once the SALSA agent 200*m* has determined the number of wafers of each product that need to be started, it performs further calculations. Each time the SALSA agent 200*m* recommends starting W wafers of a product, it calculates the number of lots L required:

$$L = [W/\text{WafersPerLot}],$$

where [ ] indicates an operation wherein the operand, if not an integer value, is assigned to smallest integer value that is greater than the operand. For instance, if W/WafersPerLot equals a value of 2.1, L is assigned a value of 3. Similarly, if W/WafersPerLot equals a value of 2.9, L is assigned a value of 3. However, if W/WafersPerLot equals a value of 2.0, no alternative value is assigned, and L takes on the value of the operand. In this manner, L is assigned the higher integer in the case that W is not an integer multiple of WafersPerLot.

It should be noted that the Starts Advisor object 220*m* is also responsible for recommending starts of products that do not feed a bottleneck. These non-bottleneck products need to be started, but because they do not feed a bottleneck they will not be selected under the approach outlined above. It is preferable to start these non-bottleneck products at times when no bottleneck is starving so that they will not compete with wafer starts that will actually feed a bottleneck resource. This approach is referred to herein as the "opportunistic" approach to starting non-bottleneck products. It is further desirable to start non-bottleneck products somewhat linearly across the starts period. If adequate starts do not occur to maintain this desired linear distribution of non-bottleneck starts throughout the starts period, then another approach may be used to start non-bottleneck products. Under this second approach, the "time-based" approach, the start period is divided into P periods, where P is a configurable input 130. For example, if P is 7 and a starts period is one week, then P includes seven one-day periods, denoted herein as starts period segments. The "time-based" approach starts non-bottleneck products in proportion to the number of starts period segments that have transpired during the starts period.

During each evaluation period, the Starts Advisor object 220*m* determines if "opportunistic" non-bottleneck product starts should occur. If so, then the Starts Advisor object 220*m* recommends that a batch of non-bottleneck products be started. In at least one embodiment, the "opportunistic" and "time-based" approaches are not used in conjunction with each other. That is, if a batch of NB starts is recommended under the "opportunistic" approach during an evaluation period, then no starts will be further recommended under the "time-based" approach. However, during any evaluation period where non-bottleneck products are not started by the "opportunistic approach," then the Starts Advisor object 220*m* determines whether any non-bottleneck products should be started according to the "time-based" approach. If the Starts Advisor object 220*m* determines that non-bottleneck starts should be recommended under either approach, then the particular product from which the starts should be selected will be determined according to the product selection process discussed above (selection of the non-bottleneck product whose actual start percentage is the lowest).

FIG. 1 indicates that the Factory Control System 140 interacts with the physical fab 100. In the fab 100, production control personnel stage lots of wafers in a WIP staging operation based on the start plan, which indicates planned starts for the starts period. The WIP staging operation is a configurable input 130 (FIG. 1). An indication of the wafers staged in the staging operation are available in the Manufacturing Execution System (MES) 141. Information regarding staging is forwarded from MES 141 to the virtual factory 110, which gets updated with the staging information from MES 141. Information regarding the staging operation is therefore available to the SALSA agent 200*m* from the virtual factory 110, based on information from MES 141.

After calculating the number of lots of a product L as described above, the SALSA agent 200*m* attempts to locate the required number of existing lots for the selected product in the staging operation as indicated in the virtual factory 110. After locating a lot of the correct product in virtual factory 110 at the staging operation, the SALSA agent 200*m* commands the MES system 141 to move the lot from the staging operation to the first production operation. Selection of the first production operation is configured via a configurable input 130. The SALSA agent 200*m* also notifies production personnel in the physical fab 100 that the new lots are available for processing at the first production operation.

Regarding other objects of the SALSA agent 200*m*, FIG. 2B illustrates that the SALSA agent 200*m* interacts with a Capacity Listener Collection class 270, via a Capacity Notifier class 260. The Capacity Notifier object 260*m* detects and provides a notification when a carryover condition occurred for the last starts period (i.e., actual starts did not meet planned starts). For a variety of reasons, the SALSA agent 200*m* may not be able to start all of the planned starts for a week. Any situation that results in lower-than-average availability of the bottleneck machines may cause actual starts to fall short of planned starts. Extended preventive maintenance or excessive unscheduled downtime are two examples of events that can reduce actual lot starts.

A configurable parameter 130 LotCarryover controls how the SALSA agent 200*m* handles the situation where actual starts are less than the planned starts at the end of the starts period. If LotCarryover is configured to a "no" value, then the SALSA agent 200m ignores the unstarted wafers for a starts period during the next starts period. In contrast, if LotCarryover is configured to a "yes" value, then the SALSA agent 200m adds the unstarted wafers from the previous starts period to the planned starts for each of the unstarted products during the next starts period. The SALSA agent 200m also notifies fab personnel when it is unable to start all planned wafer starts for a given starts period. Configuring LotCarryover to a "yes" value therefore allows the SALSA agent 200m to "make up" the previous shortfall of wafer starts during the subsequent starts period if favorable conditions arise.

The Capacity Notifier object 260m also detects and provides a notification when a an anticipated "underflow" condition exists for the current starts period (i.e., actual starts will likely need to exceed planned starts. If the Capacity Notifier object 260m detects that planned starts will likely be exhausted before the end of the starts period, an anticipated underflow notification is presented to fab personnel. Based on the underflow notification, the fab personnel have the opportunity to increase the planned starts for the starts period to take advantage of the projected capacity to process additional wafers.

FIG. 2B illustrates that the SALSA agent 200m also interacts with a Recommendation Listener Collection class 240. A Recommendation Notifier class 245 facilitates this interaction. The Lot Starter object 240m is an object of the Recommendation Listener Collection class 240.

One skilled in the art will realize that many of the processing steps discussed in the foregoing description need not be performed in the order suggested, or by the particular object suggested, as long as the same functionality is achieved.

To summarize the present invention, the Starvation Lot Start Avoidance Object is an active, autonomous software object that aids in the semiconductor processing process by starting new lots into the manufacturing queue just in time to avoid starvation of bottleneck machines. The SALSA agent 200m determines which products to start, based on the ratio of actual/planned start percentages and also based on a consideration of which product starts will alleviate the bottleneck. Thus, the SALSA agent 200m not only determines when to start new lots in order to avoid bottleneck starvation, but also determines how many lots to start and which products the new lot starts should consist of. Additionally, the SALSA agent 200m initiates the release of lots into the manufacturing line.

Alternative Embodiments

While particular embodiments of the present invention have been shown and described, it will be recognized to those skilled in the art that, based upon the teachings herein, further changes and modifications may be made without departing from this invention and its broader aspects and, thus, the appended claims are to encompass within their scope all such changes and modifications as are within the true spirit and scope of the invention.

We claim:

1. An automated system, comprising:
  a software object that provides for calculation of one or more bottleneck virtual work in process time ("VWIP") values, each of the one or more bottleneck VWIP values representing the amount of work approaching one of n bottleneck workstations;
  wherein n>0;
  wherein the work comprises at least one of m products;
  wherein m>0;
  wherein each of the bottleneck VWIP values further comprises a segment VWIP value, the segment VWIP value being associated with a segment, the segment further comprising a step;
  wherein the step is associated with a step cycle time value; and
  wherein the software object further provides for deriving the step cycle time value from any of a plurality of values, the plurality of values including a baseline cycle time and an exponentially weighted moving average ("EWMA") cycle time.

2. The automated system recited in claim 1, wherein:
  the segment further comprises one or more of a plurality of steps;
  wherein each of the plurality of steps is associated with a corresponding step cycle time value; and
  the software object further provides for determining, based on the corresponding step cycle time value, which of the plurality of steps are included in the segment.

3. The automated system recited in claim 1, wherein:
  the software object is configured to receive a selection input, and
  the software object is further configured to determine whether, based on the value of the selection input, the step cycle time value should be derived from the baseline cycle time or from the EWMA cycle time.

4. The automated system recited in claim 1, wherein:
  the software object further provides for deriving the baseline cycle time according to a standards method.

5. The automated system recited in claim 1, wherein:
  the software object further provides for deriving the baseline cycle time according to an X-factors method.

6. An automated system in a facility that manufactures m products, where m>0, comprising:
  a software object that provides for calculation of one or more bottleneck delta virtual work in process time ("VWIP") values, each of the one or more bottleneck delta VWIP values representing the amount of time until a corresponding one of n bottleneck workstations begins to risk starvation, where n>0;
  wherein the software object further provides for calculating a lead time ($L_i$) for product i for each of the m products as the sum of a plurality of step cycle times ($T_{i,s}$) for product i at step s;
  wherein the software object is configured to receive a selection input; and
  wherein the software object is further configured to determine whether, based on the value of the selection input, the plurality of step cycle times ($T_{i,s}$) should be derived from one or more baseline cycle times or from one or more exponentially weighted moving average ("EWMA") cycle times; and,
  wherein the software object further provides for deriving the one or more baseline cycle times based on an X-factors method.

7. The automated system recited in claim 6, wherein:
  the software object further provides for deriving the one or more baseline cycle times based on a standards method.

8. A method, comprising:
  calculating one or more bottleneck virtual work in process time ("VWIP") values, each of the one or more bottleneck VWIP values representing the amount of work approaching one of n bottleneck workstations;

wherein n>0;

wherein the work comprises at least one of m products;

wherein m>0;

wherein each of the bottleneck VWIP values further comprises a segment VWIP value, the segment VWIP value being associated with a segment, the segment further comprising a step;

wherein the step is associated with a step cycle time value; and deriving the step cycle time value from any of a plurality of values, the plurality of values including a baseline cycle time and an exponentially weighted moving average ("EWMA") cycle time.

9. The method recited in claim 8, wherein:

the segment further comprises one or more of a plurality of steps;

each of the plurality of steps is associated with a corresponding step cycle time value; and the method further comprises determining, based on the corresponding step cycle time value, which of the plurality of steps are included in the segment.

10. The method recited in claim 8, further comprising:

receiving a selection input; and determining, based on the value of the selection input, whether the step cycle time value should be derived from the baseline cycle time or from the EWMA cycle time.

11. The method recited in claim 8, further comprising:

deriving the baseline cycle time according to a standards method.

12. The method recited in claim 8, further comprising:

deriving the baseline cycle time according to an X-factors method.

13. A method for performing calculations in a facility that manufactures m products, where m>0, comprising:

calculating of one or more bottleneck delta virtual work in process time ("VWIP") values, each of the one or more bottleneck delta VWIP values representing the amount of time until a corresponding one of n bottleneck workstations begins to risk starvation, where n>0;

calculating a lead time ($L_i$) for product i for each of the m products as the sum of a plurality of step cycle times ($T_{i,s}$) for product i at step s;

receiving a selection input; and determining whether, based on the value of the selection input, the plurality of step cycle times ($T_{i,s}$) should be derived from one or more baseline cycle times or from one or more exponentially weighted moving average ("EWMA" cycle times; and deriving the one or more baseline cycle times based on an X-factors method.

14. The method recited in claim 13, wherein further comprising:

deriving the one or more baseline cycle times based on a standards method.

15. A method for performing calculations in a facility that manufactures m products, where m>0, comprising:

providing a software object that provides for calculation of one or more bottleneck virtual work in process time ("VWIP") values, each of the one or more bottleneck VWIP values representing the amount of work approaching one of n bottleneck workstations;

wherein n>0;

wherein the work comprises at least one of m products;

wherein m>0;

wherein each of the bottleneck VWIP values further comprises a segment VWIP value, the segment VWIP value being associated with a segment, the segment further comprising a step;

wherein the step is associated with a step cycle time value; and wherein providing a software object further comprises providing a software object that provides for deriving the step cycle time value from any of a plurality of values, the plurality of values including a baseline cycle time and an exponentially weighted moving average ("EWMA") cycle time.

16. The method recited in claim 15, wherein:

the segment further comprises one or more of a plurality of steps;

each of the plurality of steps is associated with a corresponding step cycle time value; and providing a software object further comprises providing a software object that determines, based on the corresponding step cycle time value, which of the plurality of steps are included in the segment.

17. The method recited in claim 15, wherein providing a software object further comprises:

providing a software object that receives a selection input; and providing a software object that determines, based on the value of the selection input, whether the step cycle time value should be derived from the baseline cycle time or from the EWMA cycle time.

18. The method recited in claim 15, wherein providing a software object further comprises:

providing a software object that derives the baseline cycle time according to a standards method.

19. The method recited in claim 15, wherein providing a software object further comprises:

providing a software object that derives the baseline cycle time according to an X-factors method.

20. A method for performing calculations in a facility that manufactures m products, where m>0, comprising:

provides a software object that provides for calculation of one or more bottleneck delta virtual work in process time ("VWIP") values, each of the one or more bottleneck delta VWIP values representing the amount of time until a corresponding one of n bottleneck workstations begins to risk starvation, where n>0;

wherein providing a software object further comprises providing a software object that calculates a lead time ($L_i$) for product i for each of the m products as the sum of a plurality of step cycle times ($T_{i,s}$) for product i at step s;

wherein providing a software object further comprises providing a software object that is configured to receive a selection input; and wherein providing a software object further comprises providing a software object that is further configured to determine whether, based on the value of the selection input, the plurality of step cycle times ($T_{i,s}$) should be derived from one or more baseline cycle times or from one or more exponentially weighted moving average ("EWMA") cycle times; and wherein the software object further provides for deriving the one or more baseline cycle times based on an X-factors method.

21. The method recited in claim 20, wherein:
the software object further provides for deriving the one or more baseline cycle times based on a standards method.

22. A manufacturing facility that manufactures m products, where m>0, comprising:
n bottleneck workstations; and
a software object that provides for calculation of one or more bottleneck virtual work in process time ("VWIP") values, each of the one or more bottleneck VWIP values representing the amount of work approaching one of n bottleneck workstations;
wherein n>0;
wherein the work comprises at least one of m products;
wherein m>0;
wherein each of the bottleneck VWIP values further comprises a segment VWIP value, the segment VWIP value being associated with a segment, the segment further comprising a step;
wherein the step is associated with a step cycle time value; and
wherein the software object further provides for deriving the step cycle time value from any of a plurality of values, the plurality of values including a baseline cycle time and an exponentially weighted moving average ("EWMA") cycle time.

23. The manufacturing facility recited in claim 22, wherein:
the segment further comprises one or more of a plurality of steps;
each of the plurality of steps is associated with a corresponding step cycle time value; and
the software object further provides for determining, based on the corresponding step cycle time value, which of the plurality of steps are included in the segment.

24. The manufacturing facility recited in claim 22, wherein:
the software object is configured to receive a selection input; and
the software object is further configured to determine whether, based on the value of the selection input, the step cycle time value should be derived from the baseline cycle time or from the EWMA cycle time.

25. The manufacturing facility recited in claim 22, wherein:
the software object further provides for deriving the baseline cycle time according to a standards method.

26. The manufacturing facility recited in claim 22, wherein:
the software object further provides for deriving the baseline cycle time according to an X-factors method.

27. A manufacturing facility that manufactures m products, where m>0, comprising:
a software object that provides for calculation of one or more bottleneck delta virtual work in process time ("VWIP") values, each of the one or more bottleneck delta VWIP values representing the amount of time until a corresponding one of n bottleneck workstations begins to risk starvation, where n>0;
wherein the software object further provides for calculating a lead time ($L_i$) for product i for each of the m products as the sum of a plurality of step cycle times ($T_{i,s}$) for product i at step s;
wherein the software object is configured to receive a selection input; and
wherein the software object is further configured to determine whether, based on the value of the selection input, the plurality of step cycle times ($T_{i,s}$) should be derived from one or more baseline cycle times or from one or more exponentially weighted moving average ("EWMA") cycle times; and,
wherein the software object further provides for deriving the one or more baseline cycle times based on an X-factors method.

28. The manufacturing facility recited in claim 27, wherein: the software object further provides for deriving the one or more baseline cycle times based on a standards method.

* * * * *